US012777978B2

(12) United States Patent
Wen et al.

(10) Patent No.: US 12,777,978 B2
(45) Date of Patent: Oct. 27, 2026

(54) SEMICONDUCTOR DEVICE AND METHOD

(71) Applicant: Taiwan Semiconductor Manufacturing Co., Ltd., Hsinchu (TW)

(72) Inventors: Ke-Gang Wen, Hsinchu (TW); Yu-Bey Wu, Hsinchu (TW); Liang-Wei Wang, Hsinchu (TW); Hsin-Feng Chen, Yilan City (TW); Tsung-Chieh Hsiao, Shetou Township (TW); Chih Chuan Su, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 318 days.

(21) Appl. No.: 18/403,064

(22) Filed: Jan. 3, 2024

(65) Prior Publication Data

US 2025/0070064 A1 Feb. 27, 2025

Related U.S. Application Data

(60) Provisional application No. 63/520,713, filed on Aug. 21, 2023.

(51) Int. Cl.

*H10W 90/00* (2026.01)
*H10W 20/20* (2026.01)
(Continued)

(52) U.S. Cl.

CPC ........... *H10W 90/00* (2026.01); *H10W 20/20* (2026.01); *H10W 42/121* (2026.01);
(Continued)

(58) Field of Classification Search

CPC ........ H10P 54/922; H10P 54/00; H10P 54/20; H10P 54/40; H10W 20/023
See application file for complete search history.

(56) References Cited

U.S. PATENT DOCUMENTS 8,513,119 B2 * 8/2013 Chang .................... H10P 72/74 257/E21.585
11,817,426 B2 11/2023 Chen et al.
(Continued)

FOREIGN PATENT DOCUMENTS

EP 2913848 A1 * 9/2015 ........ H10W 20/0234
KR 20090031829 A * 3/2009 ............ H10W 90/00
(Continued)

*Primary Examiner* — Evren Seven
(74) *Attorney, Agent, or Firm* — Slater Matsil, LLP

(57) ABSTRACT

An embodiment is a device including a first die and a substrate including a first surface and a second surface opposite the first surface. The device also includes an active device on the first surface of the substrate. The device also includes a first interconnect structure on the first surface of the substrate. The device also includes a through substrate via extending through the first interconnect structure and the substrate to the second surface of the substrate, the through substrate via being electrically coupled to metallization patterns in the first interconnect structure. The device also includes one or more material-filled trench structures extending from the second surface of the substrate into the substrate, the one or more material-filled trench structures being electrically isolated from the through substrate via.

20 Claims, 26 Drawing Sheets

(51) Int. Cl.

| | |
|---|---|
| ***H10W 42/00*** | (2026.01) |
| ***H10W 70/65*** | (2026.01) |
| ***H10W 72/00*** | (2026.01) |
| ***H10W 74/00*** | (2026.01) |

(52) U.S. Cl.

CPC ........ *H10W 70/65* (2026.01); *H10W 72/0198* (2026.01); *H10W 74/00* (2026.01); *H10W 90/734* (2026.01); *H10W 90/794* (2026.01)

(56) References Cited

U.S. PATENT DOCUMENTS

| | | | | |
|---|---|---|---|---|
| 12,125,820 | B2 | 10/2024 | Chen et al. | |
| 2010/0090304 | A1 * | 4/2010 | Liu ........................ | H10F 39/011 257/E31.127 |
| 2014/0264770 | A1 * | 9/2014 | Okandan .................. | H10P 54/00 257/620 |
| 2017/0062277 | A1 * | 3/2017 | Schrems .................. | H10P 54/00 |
| 2024/0379746 | A1 | 11/2024 | Chang et al. | |

FOREIGN PATENT DOCUMENTS

| | | | | |
|---|---|---|---|---|
| TW | 200411809 | A * | 7/2004 | .......... H10W 74/129 |
| TW | 202230541 | A | 8/2022 | |
| TW | 202232707 | A | 8/2022 | |
| TW | 202310231 | A | 3/2023 | |

* cited by examiner

SEMICONDUCTOR DEVICE AND METHOD

PRIORITY CLAIM AND CROSS-REFERENCE

This application claims the benefit of U.S. Provisional Application No. 63/520,713 filed on Aug. 21, 2023, entitled "3DIC Semiconductor Device with Wafer Warpage Management and Method of Manufacturing the Same," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

1 through 13, 14A, 14B, 14C, and 15 through 18 illustrate cross-sectional views and plan views of intermediate stages in the formation of a structure according to embodiments.

DETAILED DESCRIPTION

Figure 1:
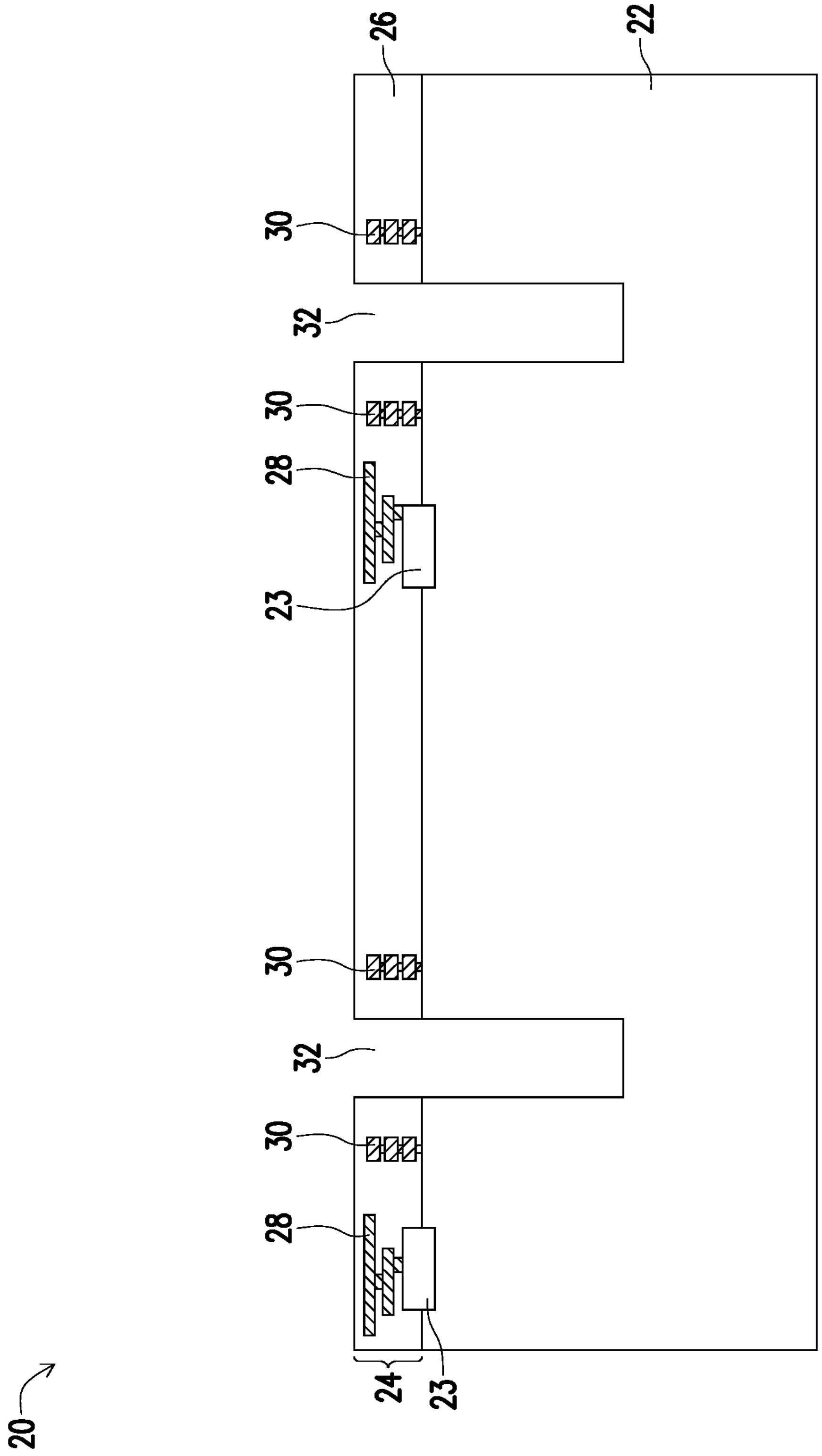

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a warpage tuning process that can control die warpage. In some embodiments, the warpage tuning process is applied to the backside of the die(s). For example, the warpage tuning structure may include one or more through substrate vias (TSVs) in the backside of the die(s). The warpage tuning TSVs do not necessarily extend completely through the substrate or die, but in some embodiments, extend partially into the backside of the substrate. In some embodiments, the warpage tuning TSVs can be filled with a tensile material, such as conductive material. In some embodiments, the warpage tuning TSVs can be filled with a compressive material, such as dielectric material. The compressive material may be used for dies with a backside having convex warpage (sometimes referred to as crying or frowning warpage). The tensile material may be used for dies with a backside having concave warpage (sometimes referred to as smiling warpage). By having the warpage tuning TSVs, the warpage control of the dies is improved which can improve the warpage control for package structures, such as 3DICs that include the dies. Further, in embodiments with conductive TSVs as the warpage tuning TSVs, the heat dissipation of the die can be improved.

Further, the teachings of this disclosure are applicable to any device or package needing warpage control. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 13, 14A, 14B, 14C, and 15 through 18 illustrate cross-sectional and plan views of intermediate stages in the formation of a structure/dies 20 in a TSV-first process in accordance with some embodiments.

FIG. 1 illustrates a cross-sectional view of a structure 20 in accordance with some embodiments. The structure 20 will be packaged in subsequent processing to form an integrated circuit package. The structure 20 may include a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The structure 20 may be formed in a wafer, which may include different device regions that are singulated in subsequent steps to form a plurality of integrated circuit dies. The structure 20 may be processed according to applicable manufacturing processes to form integrated circuits. For example, the structure 20 includes a substrate 22, such as silicon, doped or undoped, or an active layer of a semiconductor-on-insulator (SOI) substrate. The substrate 22 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 22 has an active surface (e.g., the surface facing upwards in FIG. 1), sometimes called a front side, and an inactive surface (e.g., the surface facing downwards in FIG. 1), sometimes called a back side.

Devices 23 may be formed at the front surface of the substrate 22. The devices 23 may be active devices (e.g., transistors, diodes, etc.), capacitors, resistors, the like, or a combination thereof. An inter-layer dielectric (ILD) (not separately illustrated) is over the front surface of the substrate 22. The ILD surrounds and may cover the devices 23. The ILD may include one or more dielectric layers formed of materials such as Phospho-Silicate Glass (PSG), Boro-Silicate Glass (BSG), Boron-Doped Phospho-Silicate Glass (BPSG), Undoped Silicate Glass (USG), or the like.

Conductive plugs (not separately illustrated) extend through the ILD to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof.

An interconnect structure 24 is over the ILD and the conductive plugs. The interconnect structure 24 may be formed by, for example, metallization patterns 28, 30 in dielectric layers 26 on the ILD. In these embodiments, the metallization patterns 28, 30 are formed in the middle-end-of-line and the back-end-of-line processing. The metallization patterns 28, 30 include metal lines and vias formed in one or more low-k dielectric layers 26. The metallization patterns may be formed using any suitable process, such as a single damascene process, a dual damascene process, a plating process, combinations thereof, or the like.

The metallization patterns 28, 30 include active metallization patterns 28 and guard rings 30. The active metallization patterns 28 of the interconnect structure 24 interconnects the devices to form an integrated circuit. The active metallization patterns 28 are electrically coupled to the devices by the conductive plugs. The metallization patterns may further include dummy metallization pattern (not shown) that electrically isolated from the devices 23 of the structure 20.

The guard rings 30 are formed around areas of subsequent formed through substrate vias (TSVs) (see e.g., openings 32 discussed below). The guard rings 30 are formed simultaneously and by the same processes as the active metallization patterns 28. The guard rings 30 can reduce the leakage current between the subsequently formed TSVs and the substrate 22 and other structures in the interconnect structure 24. In addition, TSVs can introduce mechanical stress and the guard rings 30 can provide stress relief during the fabrication and operation of the device. Further, the guard rings 30 can provide electrical isolation between the TSVs and nearby active devices and metallization patterns. The dummy metallization patterns may provide a more uniform pattern density in the interconnect structure 24 which can help with planarization and process consistency, such as during a chemical mechanical polishing (CMP) process.

After forming the interconnect structure 24, a mask (not shown) is formed and patterned on the interconnect structure 24. In some embodiments, the mask is a photoresist and may be formed by spin coating or the like and may be exposed to light for patterning. The pattern of the photoresist corresponds to the subsequently formed through substrate via (TSV) 36 (see, e.g., FIG. 4). The patterning forms at least one opening through the photoresist to expose the interconnect structure 24. In some embodiments, a stop layer (not shown), such as a chemical mechanical polishing (CMP) stop layer is deposited over a top surface of the interconnect structure 24 before the mask. The CMP stop layer may be used to prevent a subsequent CMP process from removing too much material by being resistant to the subsequent CMP process and/or by providing a detectable stopping point for the subsequent CMP process. In some embodiments, the CMP stop layer may comprise one or more layers of dielectric materials. Suitable dielectric materials may include oxides (such as silicon oxide, aluminum oxide, or the like), nitrides (such as SiN or the like), oxynitrides (such as SiON or the like), oxycarbides (such as SiOC, or the like), carbonitrides (such as SiCN, or the like), carbides (such as SiC, or the like), combinations thereof, or the like, and may be formed using spin-on coating, chemical vapor deposition (CVD), plasma-enhanced CVD (PECVD), atomic layer deposition (ALD), the like, or a combination thereof.

Further in FIG. 1, the patterned mask is used as a mask during an etching process to remove exposed and underlying portions of the dielectric layer(s) 26 of the interconnect structure 24 and the substrate 22. A single etch process may be used to etch openings 32 in the interconnect structure 24 and the substrate 22 or a first etch process may be used to etch the interconnect structure 24 and a second etch process may be used to etch the substrate 22. In some embodiments, the opening 32 is formed with a plasma dry etch process, and a reactive ion etch (RIE) process, such as a deep RIE (DRIE) process. In some embodiments, the DRIE process includes etch cycle(s) and passivation cycle(s) with the etch cycle(s) using, for example, $SF_6$, and the passivation cycle(s) using, for example, $C_4F_8$. The utilization of a DRIE process with the passivation cycle(s) and the etch cycle(s) enables a highly anisotropic etching process. In some embodiments, the etch process(es) may be any acceptable etching process, such as by wet or dry etching.

After forming the openings 32, the photoresist is removed. The photoresist may be removed by an acceptable ashing or stripping process, such as using an oxygen plasma or the like.

Figure 2:
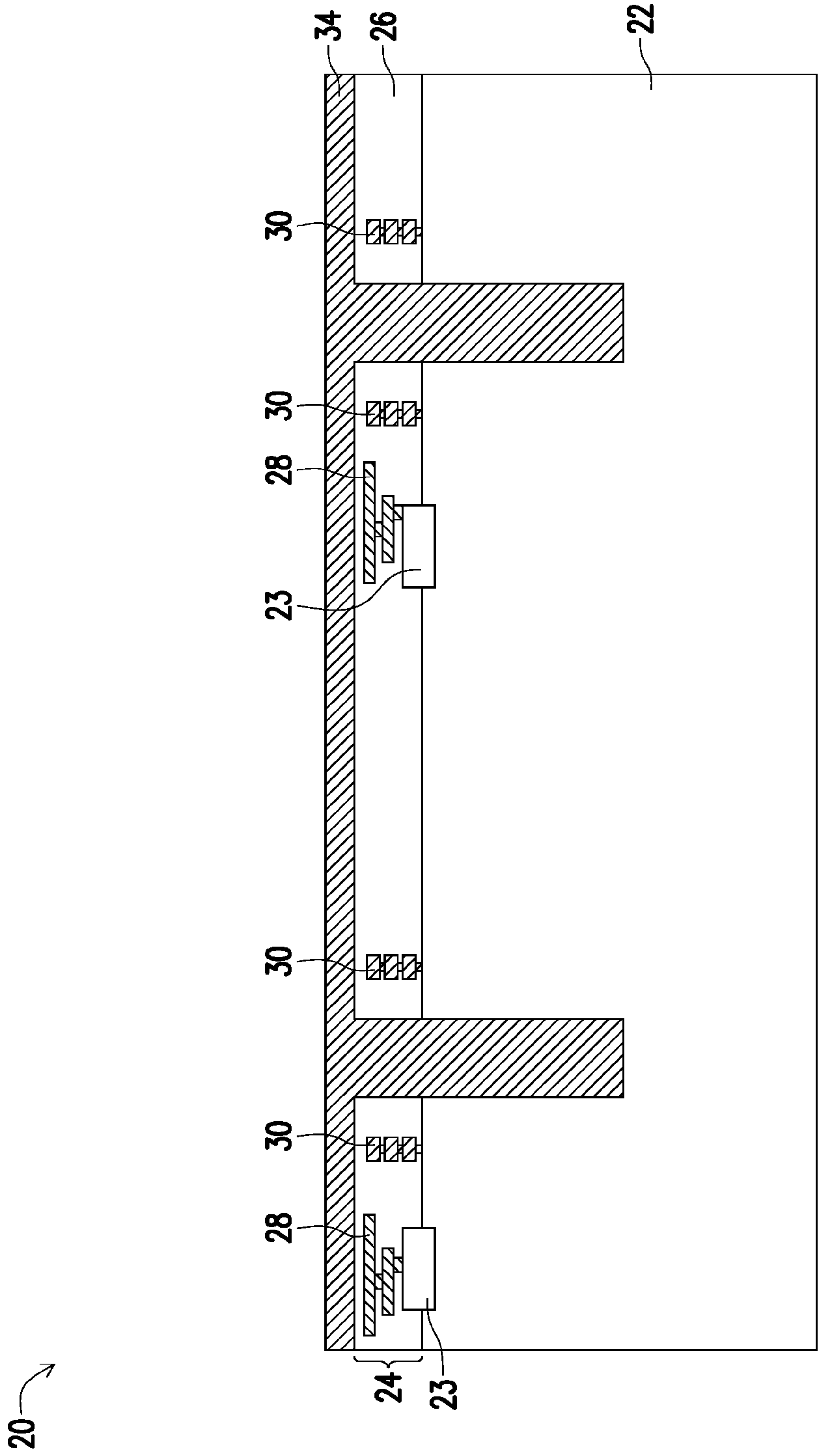

In FIG. 2, conductive material 34 is formed on the interconnect structure 24 and in the openings 32. In some embodiments, before the conductive material 34 is formed, a liner layer (not separately illustrated) and a seed layer (not separately illustrated) are formed on the interconnect structure and in the openings 32. For example, the liner layer is conformally deposited on the interconnect structure 24 and on bottom surfaces and sidewalls of the openings 32. In some embodiments, the liner layer includes one or more layers of dielectric materials and may be used to physically and electrically isolate the subsequently formed through vias 36 from the substrate 22. Suitable dielectric materials may include oxides (such as silicon oxide, aluminum oxide, or the like), nitrides (such as SiN, or the like), oxynitrides (such as SiON, or the like), combinations thereof, or the like. The liner layer may be formed using CVD, PECVD, ALD, the like, or a combination thereof.

In a subsequent step, a seed layer is formed over liner layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. In some embodiments, a barrier layer (not shown) may be formed on the liner layer prior to forming the seed layer. The barrier layer may comprise Ti, TiN, the like, or a combination thereof.

The conductive material 34 is formed on the seed layer and fills the openings 32. The conductive material 34 may be formed by plating, such as electroplating including electrochemical plating, electroless plating, or the like. The conductive material may comprise a metal, like copper, titanium, tungsten, aluminum, or the like.

After the conductive material 34 is formed, an anneal process is then performed. The anneal process may be performed to prevent subsequent extrusion of the conductive material of the TSV 36 (sometime referred to as TSV pumping). The TSV pumping is caused by a coefficient of thermal expansion (CTE) mismatch between the conductive material 34 and the substrate 22 and can cause damage to structures (e.g., metallization patterns) over the TSV.

Figure 3:
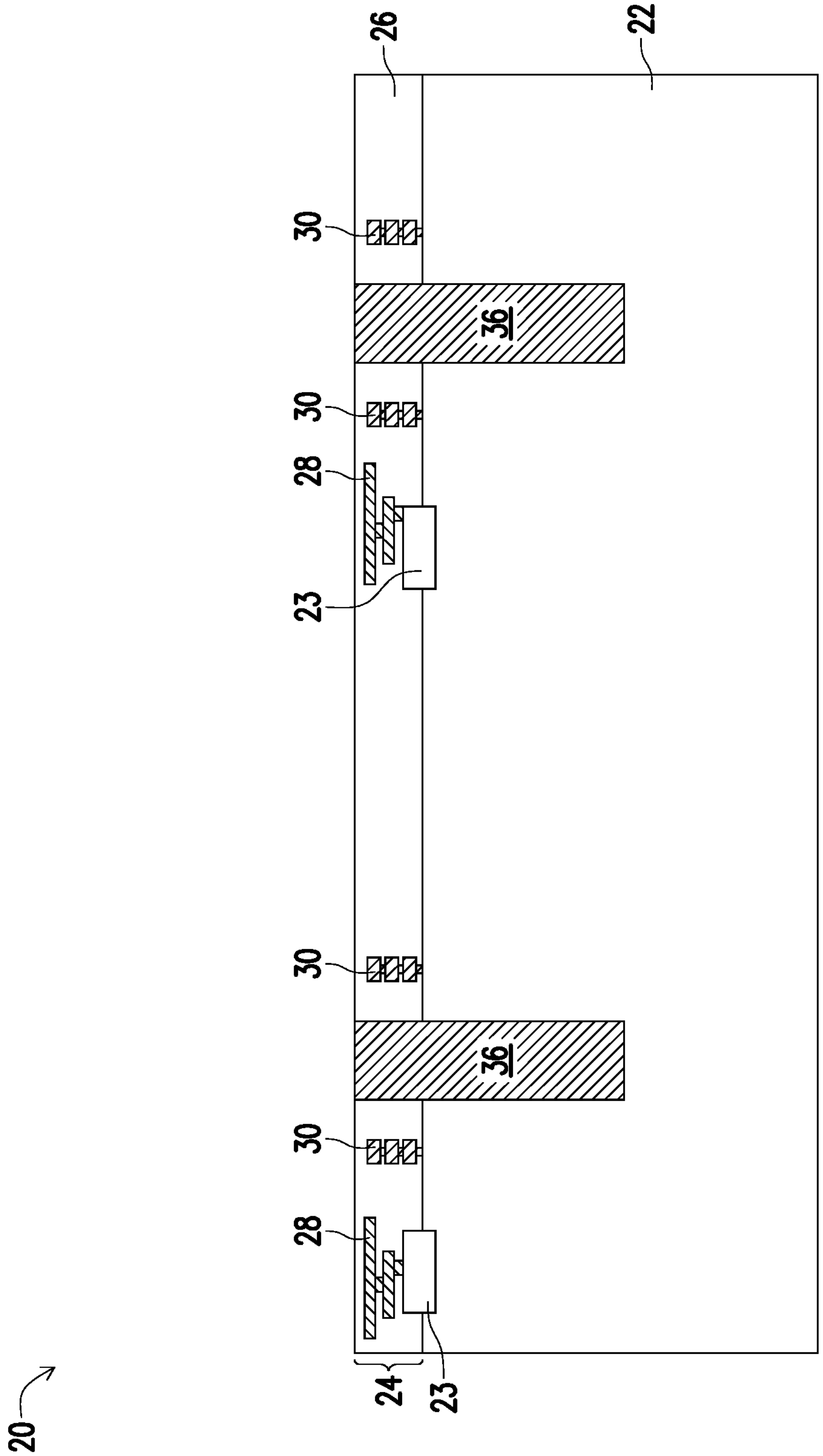

Following the anneal process, a planarization process is performed to remove portions of the conductive material 34, the seed layer, and the liner layer outside the openings 32 to form TSVs 36 as illustrated in FIG. 3. Top surfaces of the TSV 36 and the topmost dielectric layer 26 of the interconnect structure 24 are coplanar after the planarization process within process variations. The planarization process may be, for example, a chemical-mechanical polish (CMP), a grinding process, or the like. In some embodiments, the upper portion of the TSV 36 (formed in the interconnect structure 24) has a greater width than the lower portion of the TSV 36 (formed in the substrate 22). In some embodiments, the width of the TSV 36 is constant through the interconnect 24 and the substrate 22.

Figure 4:
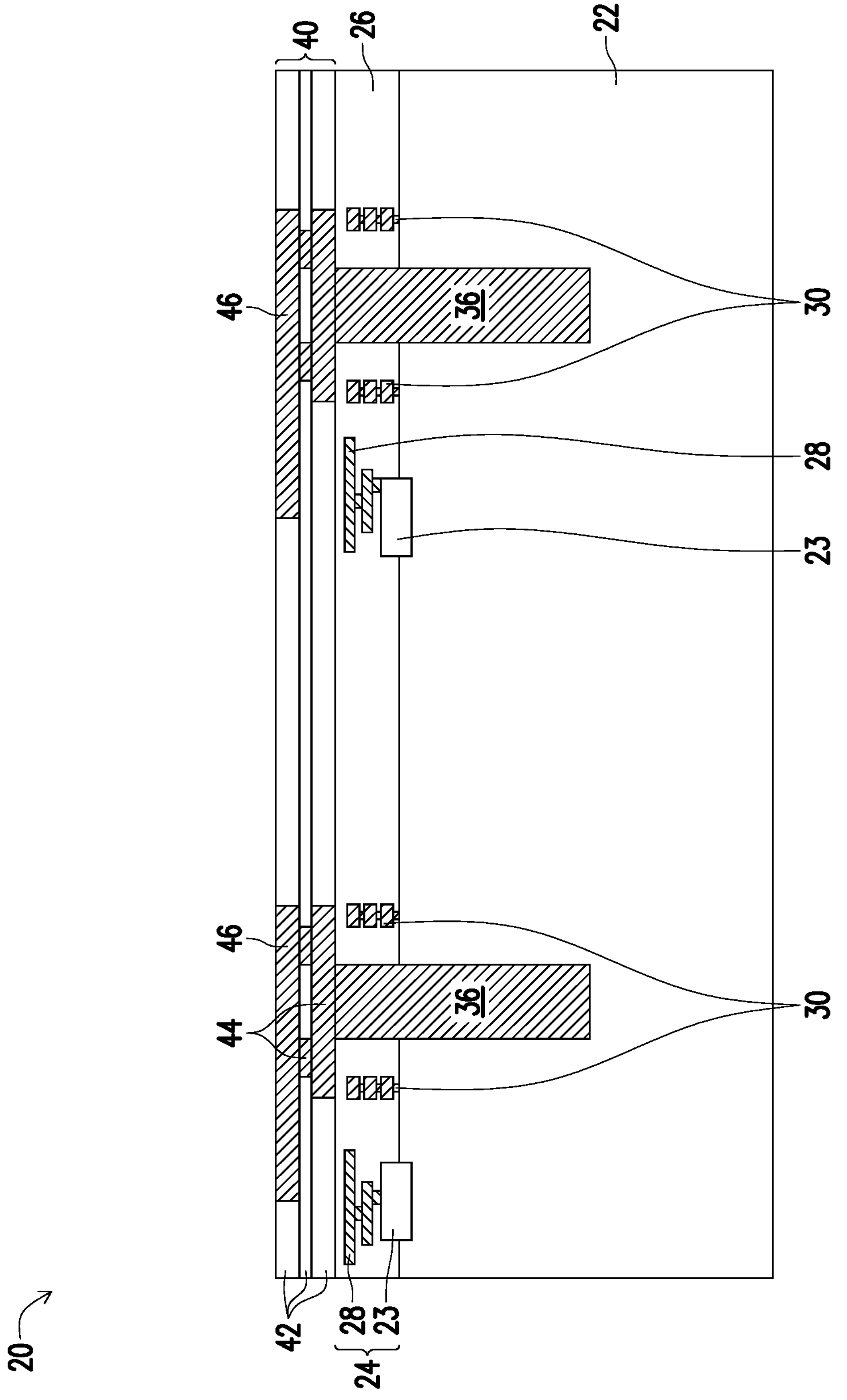

Referring to FIG. 4, an interconnect structure 40 is formed over the structure of FIG. 3. The interconnect structure 40 includes dielectric layers 42, metallization patterns and vias 44, and top metal 46. In some embodiments, the metallization pattern 44 may be a top metal metallization pattern and either the top metal 46 can be omitted or multiple top metal layers are included. More or fewer dielectric layers and metallization patterns and vias may be formed than is shown in FIG. 4. The interconnect structure 40 is connected to the active metallization patterns 28 of the interconnect structure 24 and TSV 36 by metallization patterns and vias formed in the dielectric layer(s) 42. The metallization patterns and vias may be formed similar processes and materials as the interconnect structure 24 and the description is not repeated herein. In some embodiments, there are more than one layer of top metal 46, such as two top metal layers.

In some embodiments, the dielectric layers 42 are a same material as the dielectric layers 26 of the interconnect structure 24, e.g., low-k dielectric. In other embodiments, the dielectric layers 42 are formed of a silicon-containing material (which may or may not include oxygen). For example, the dielectric layers 42 may include an oxide such as silicon oxide, a nitride such as silicon nitride, or the like.

The metallization patterns and vias 44 and the top metal 46 may be formed using any suitable process, such as a single damascene process, a dual damascene process, a plating process, combinations thereof, or the like. An example of forming the metallization patterns and vias 44 and the top metal 46 by a damascene process includes etching dielectric layers 42 to form openings, depositing a conductive barrier layer into the openings, plating a metallic material such as copper or a copper alloy, and performing a planarization to remove the excess portions of the metallic material. In other embodiments, the formation of the dielectric layers 42, the metallization patterns and vias 44, and the top metal 46 may include forming the dielectric layer 42, patterning the dielectric layer 42 to form openings, forming a metal seed layer (not shown), forming a patterned plating mask (such as photoresist) to cover some portions of the metal seed layer, while leaving other portions exposed, plating the metallization patterns and vias 44 and the top metal 46, removing the plating mask, and etching undesirable portions of the metal seed layer. The metallization patterns and vias 44 and top metal 46 may be made of tungsten, cobalt, nickel, copper, silver, gold, aluminum, the like, or combinations thereof. In some embodiments, the top metal 46 is thicker than the metallization patterns 44, such as three times thicker, five times thicker, or any suitable thickness ratio between the metallization layers.

Figure 5:
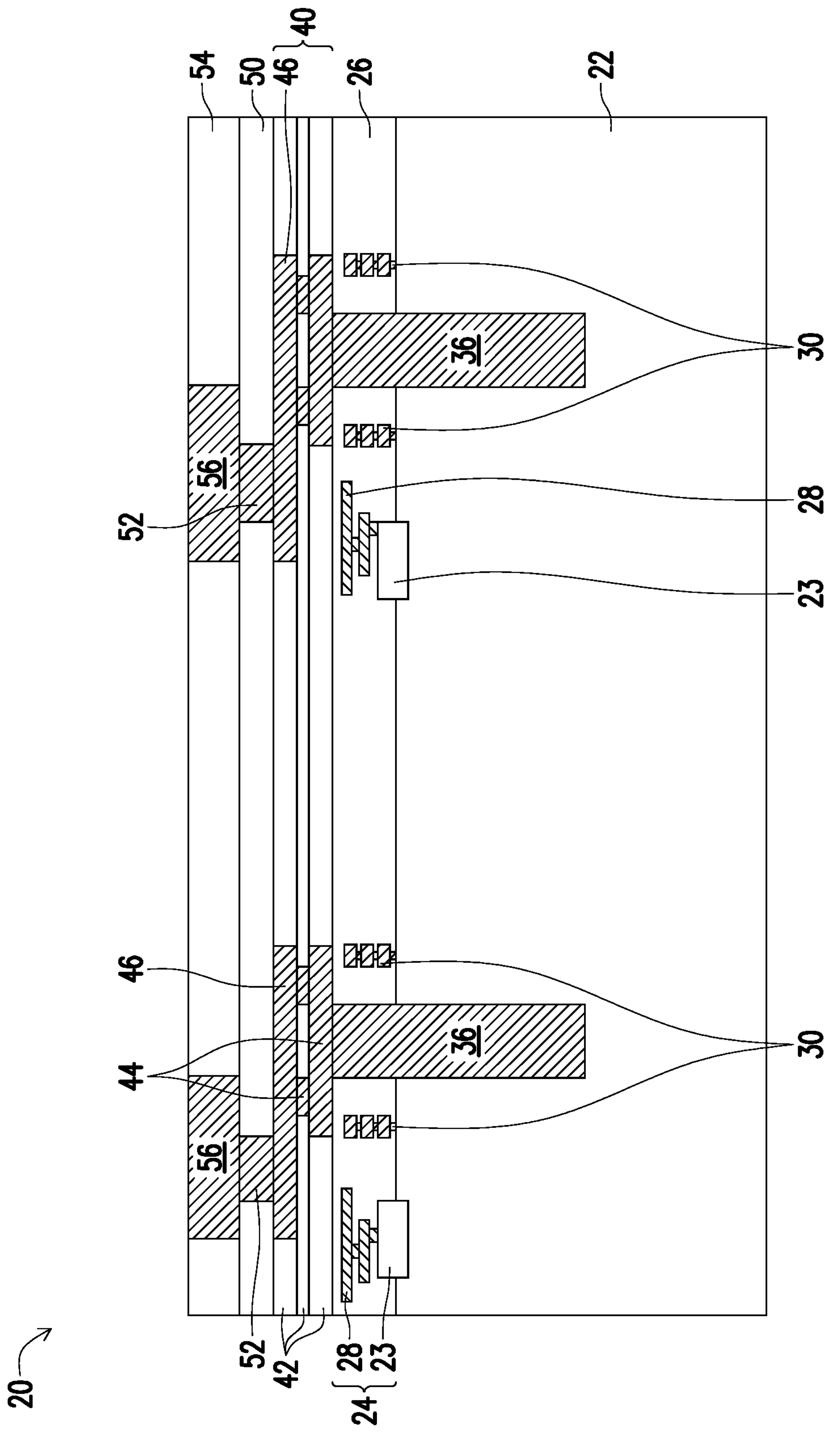

FIG. 5 illustrates the formation of a dielectric layer 50 over the dielectric layers 42 and the top metal 46 and the formation of pad vias 52 in the dielectric layer 50 and contact pads 56 in passivation layer 54. In some embodiments, the dielectric layer 50 is formed of a same material as the dielectric layers 42. In some embodiments, the dielectric layer 50 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 50 may be formed, for example, by spin coating, lamination, chemical vapor deposition (CVD), or the like. The dielectric layer 50 may have an upper surface that is level within process variations.

Although FIG. 5 illustrates the TSVs 36 directly connected to the interconnect structure 40, in some embodiments, one or more of the TSVs 36 may be directly connected to the interconnect 24.

Further in FIG. 5, a passivation layer 54 is formed over the dielectric layer 50. In some embodiments, the passivation layer 54 is formed of a same material as the dielectric layers 42. In some embodiments, the passivation layer 54 may be a polymer such as (PBO), polyimide, (BCB), or the like; a nitride such as silicon nitride or the like; an oxide such as silicon oxide, (PSG), (BSG), (BPSG), or the like; the like; or a combination thereof. The passivation layer 54 may be formed, for example, by spin coating, lamination, chemical vapor deposition (CVD), or the like. The passivation layer 54 may have an upper surface that is level within process variations.

FIG. 5 further illustrates the formation of pad vias 52 and contact pads 56 are formed in the dielectric layers 50 and the passivation layer 54. The pad vias 52 and contact pads 56 are connected to the top metal 46. The pad vias 52 and contact pads 56 may be formed using be achieved using any suitable process, such as a single damascene process, a dual damascene process, combinations thereof, or the like. A dual damascene process will be described.

In some embodiments, a photoresist (not shown) is formed and patterned on the dielectric layer. The photoresist may be formed by spin coating or the like and may be exposed to light for patterning. The pattern of the photoresist corresponds to openings for the contact pads 56. Further, the passivation layer 54 is patterned to form the openings using the patterned photoresist as a mask with the patterning process stopping on the dielectric layer 50 (or etch stop layer if present). The exposed portions of the passivation layer 54 may be removed, such as by using an acceptable etching process, such as by wet and/or dry etching.

The photoresist is removed and may be removed by an acceptable ashing or stripping process, such as using an oxygen plasma or the like. Next, another photoresist (not shown) is formed and patterned on the patterned passivation layer 54 and in the openings through the passivation layer 54. The photoresist may be formed by spin coating or the like and may be exposed to light for patterning. The pattern of the photoresist corresponds to openings for the pad vias 52. The dielectric layer 50 is patterned to form the openings using the patterned photoresist as a mask with the patterning process exposing portions of the top metal 46. The exposed portions of the dielectric layer 50 may be removed, such as by using an acceptable etching process, such as by wet and/or dry etching.

The photoresist is removed the pad vias 52 and the contact pads 56 are formed in the openings. In some embodiments, a barrier layer may be formed in the openings prior to forming pad vias 52 and the contact pads 56. In some embodiments, the barrier layer may comprise Ti, TiN, the like, or a combination thereof. The pad vias 52 and the contact pads 56 may be formed by similar processes and materials as the top metal 46 and vias 44 and the description is not repeated herein. The contact pads 56 may be formed of or comprise copper, aluminum, or an alloy thereof, for example.

The top surfaces of the contact pads 56 are coplanar (within process variation) with the top surface of the passivation layer 54. The planarization is achieved through a chemical mechanical polishing (CMP) process or a mechanical grinding process.

Figure 6:
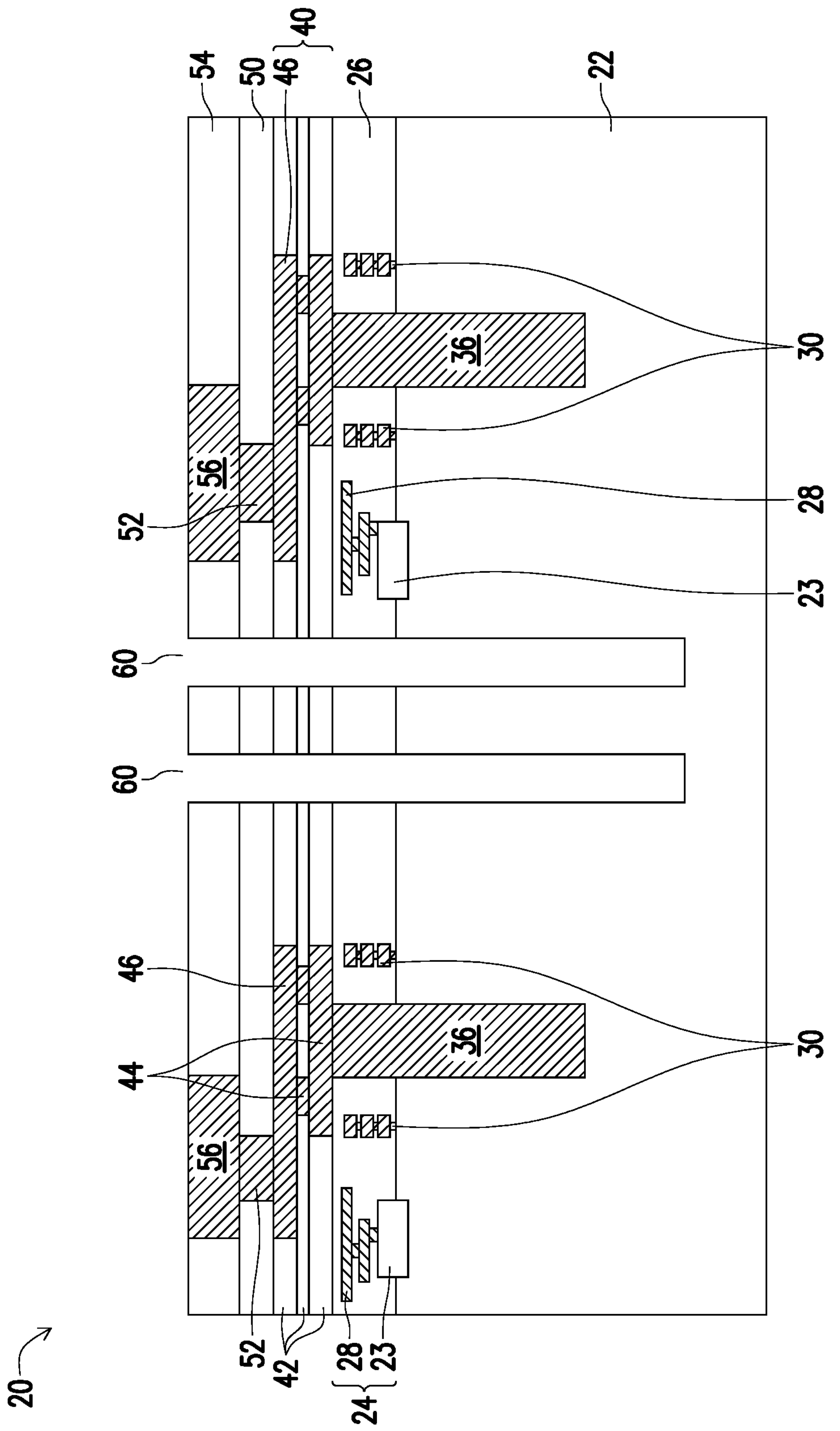

In FIG. 6, trenches 60 are formed by an etching process. These trenches 60 may be used for a dicing process to separate the structure 20 into multiple dies 20A and 20B (see, e.g., FIG. 12). In some embodiments, the trenches 60 are formed through the dielectric layer 54, the dielectric layer 50, the interconnects 40 and 24 and partially into the substrate 22. In some embodiments, the etching process is a plasma etching process or the like.

Figure 7:
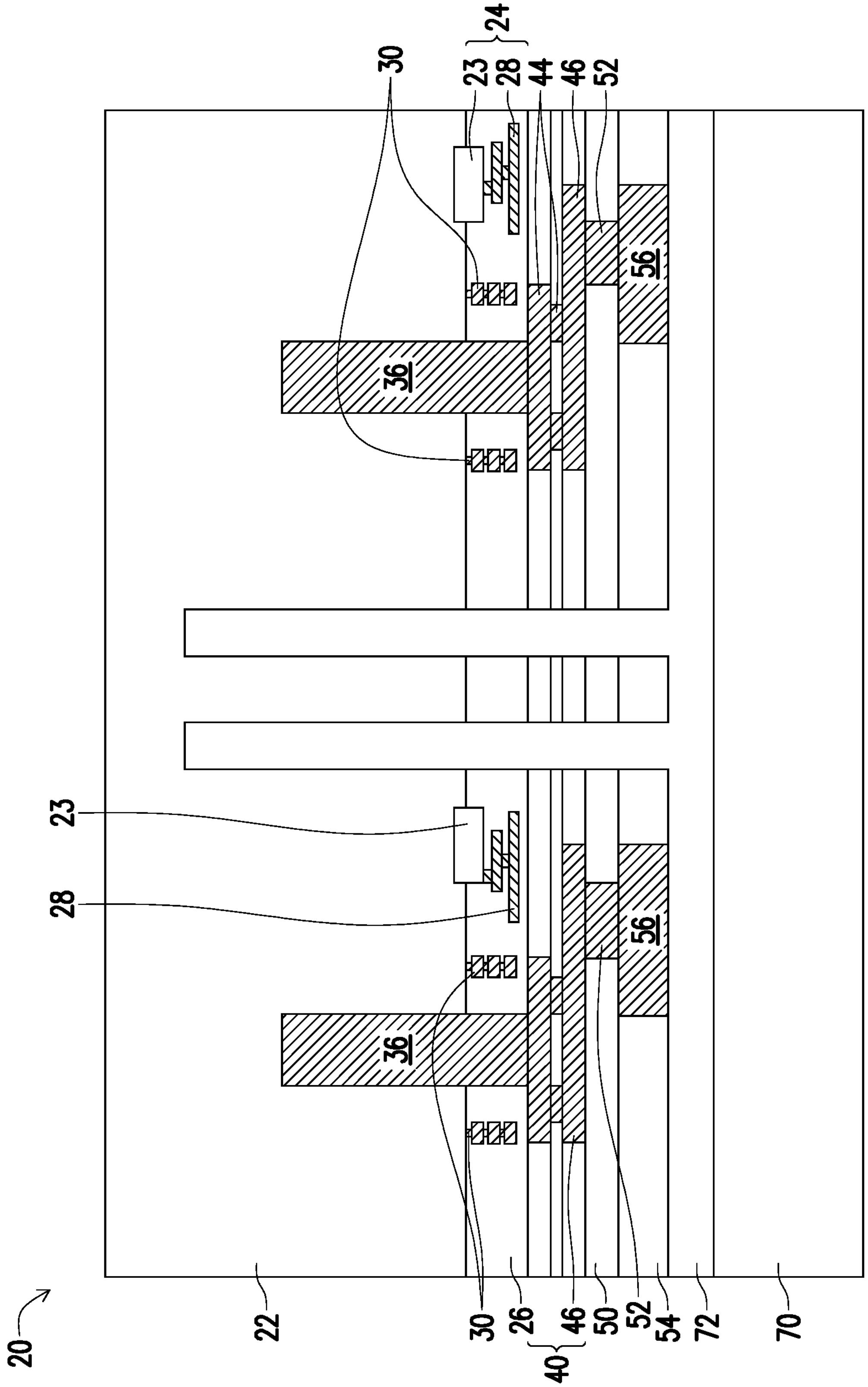

In FIG. 7, the structure of FIG. 6 is flipped over and attached to a substrate 70. The substrate 70 may be referred to as a carrier substrate 70. The carrier substrate 70 may be a glass carrier substrate, a ceramic carrier substrate, or the like. The carrier substrate 70 may be a wafer, such that multiple structures 20 can be attached to the carrier substrate 70 simultaneously. The structures 20 can be attached by a bottom antireflective coating (BARC) 72 between the structure 20 and the carrier substrate 70. The BARC 72 may fill the trenches 60. The BARC 72 may be a of a polymer-based material.

In some embodiments, a release layer (not shown) is formed on the carrier substrate 70, and the structure 20 and BARC 72 are attached to the release layer. The release layer may be formed of a polymer-based material, which may be removed along with the carrier substrate 70 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 70, or may be the like. The top surface of the release layer may be leveled and be substantially planar within process variations.

Figure 8:
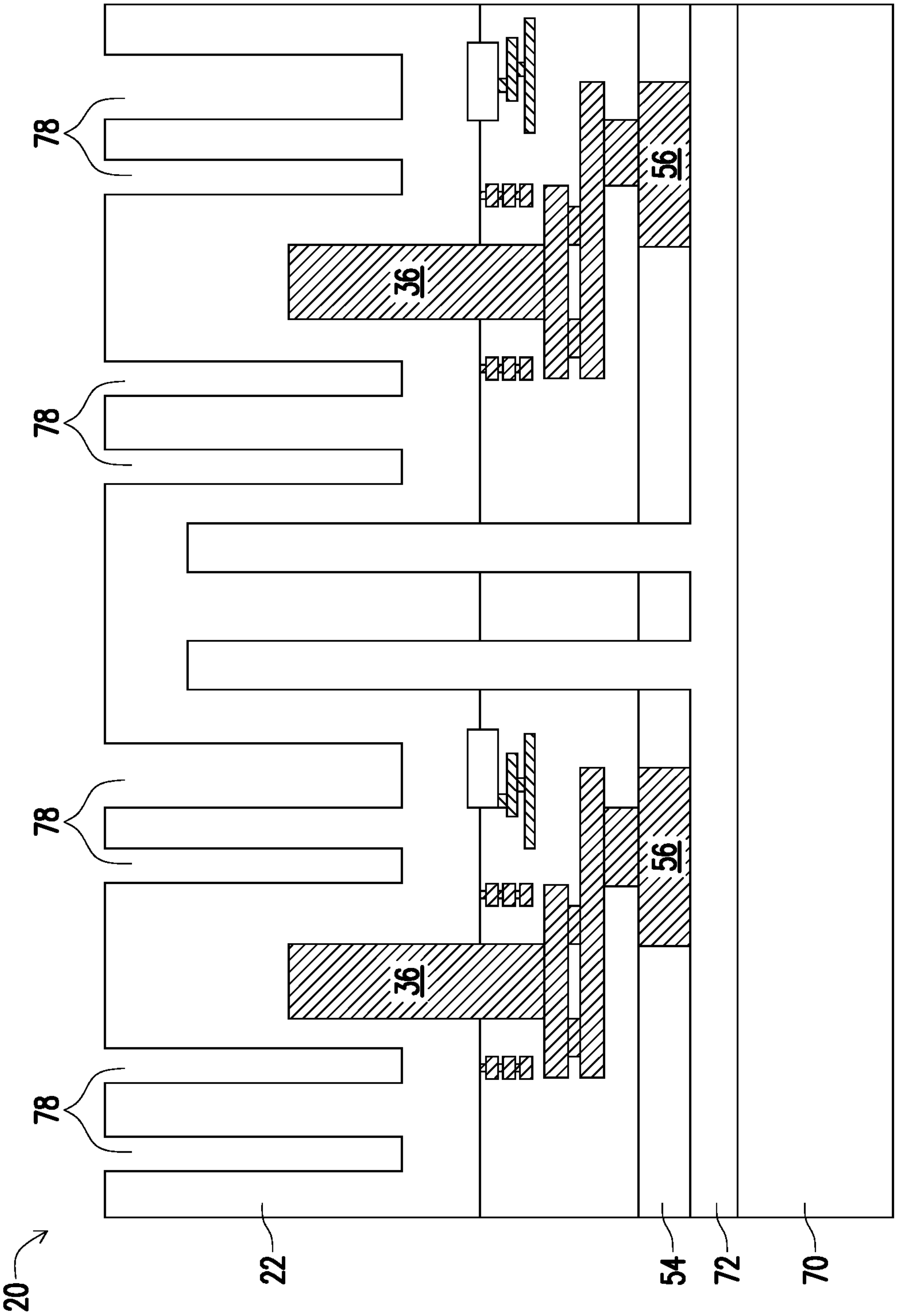

In FIG. 8, trenches 78 are formed in the backside of the substrate 22 of the structure 20. These trenches 78 will be subsequently filled with material to form warpage tuning structures (see, e.g., FIG. 11). The trenches 78 may be formed in a similar manner as the openings 32 and the process is not repeated herein. In some embodiments, the trenches 78 have different widths and shapes depending on the warpage tuning properties of the structure 20 as discussed further below. In some embodiments, the trenches 78 are formed partially but not completely through the substrate 22.

Figure 9:
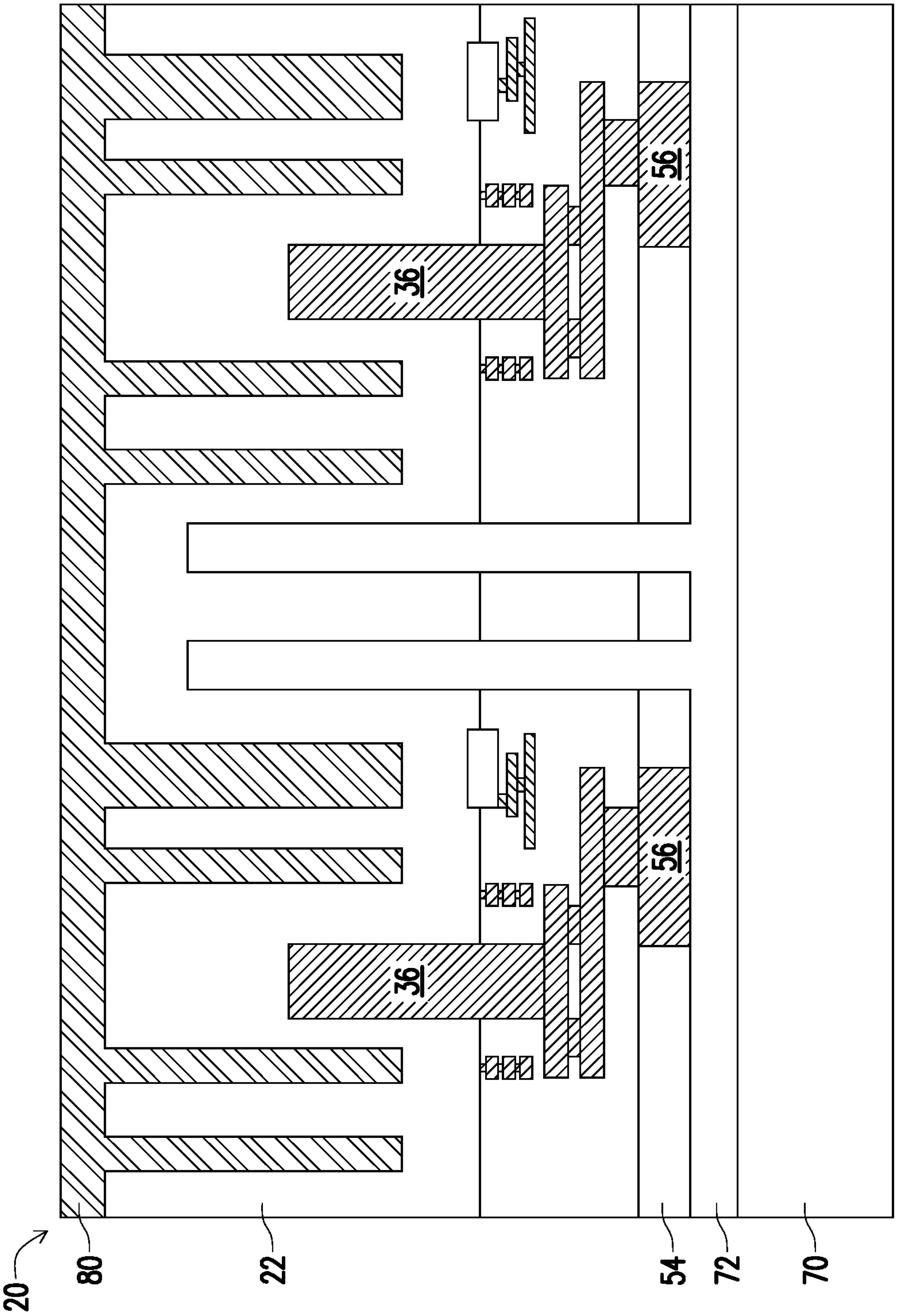

In FIG. 9, warpage tuning material 80 is formed on the backside of the substrate 22 and in the trenches 78. In some embodiments, the warpage tuning material 80 includes a liner layer and seed layer as discussed above for the TSVs 36 and is not repeated herein. In some embodiments, the warpage tuning material 80 is a tensile material, such as conductive material, and in some embodiments, the warpage tuning material 80 is a compressive material, such as dielectric material. In the embodiments with a tensile warpage tuning material 80, the warpage tuning material 80 comprises a conductive material such as gold, silver, copper, iron, tin, aluminum, the like, or alloys thereof. In the embodiments with a compressive warpage tuning material 80, the warpage tuning material 80 comprises a dielectric material such as oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like.

The compressive material may be used for structures with a backside having convex warpage profile or tendency (sometimes referred to as crying or frowning warpage). The tensile material may be used for structures with a backside having concave warpage profile or tendency (sometimes referred to as smiling warpage). In some embodiments, a combination of the tensile and compressive material is used for some structures.

Figure 10:
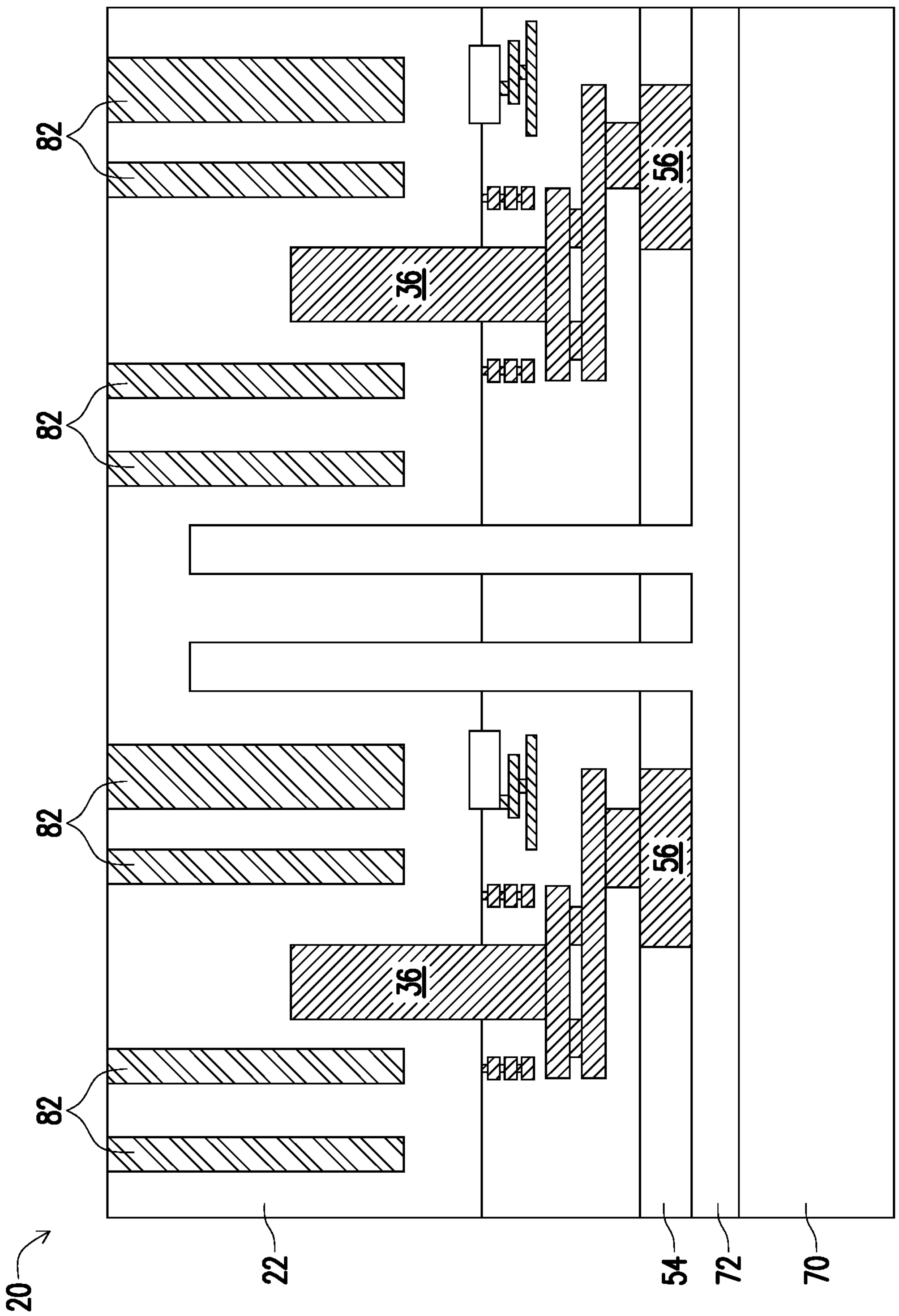

In FIG. 10, a planarization process is performed to remove portions of the warpage tuning material 80 (and other layers present, such as seed layer and liner layer) outside trenches 78 to form warpage tuning structures 82 (may also be referred to as warpage tuning TSVs 82). In some embodiments, some of the warpage tuning structures 82 are filled with tensile material (e.g., conductive material), while others of the warpage tuning structures are filled with compressive material (e.g., dielectric material). Top surfaces of the warpage tuning structures 82 and the backside surface of the substrate 22 are coplanar after the planarization process within process variations. The planarization process may be, for example, a chemical-mechanical polish (CMP), a grinding process, or the like.

The warpage tuning structures 82 are electrically isolated from the TSVs 36 and the interconnect structures 24 and 40 of the dies 20A/B. As discussed above and below, the warpage tuning structures are for helping to control the warpage of the dies and are not used for electrical connections within the dies 20A/B and the subsequent package structures.

By having the warpage tuning structures 82, the warpage control of the dies 20A/B is improved. Thus, the yield of the dies is improved. Further, due to the improved planarity of the dies 20A/B, the reliability of the electrical connections between the dies 20A/B and other components in the package structures is improved. Thus, the reliability and performance of the package structures are improved.

Figure 11:
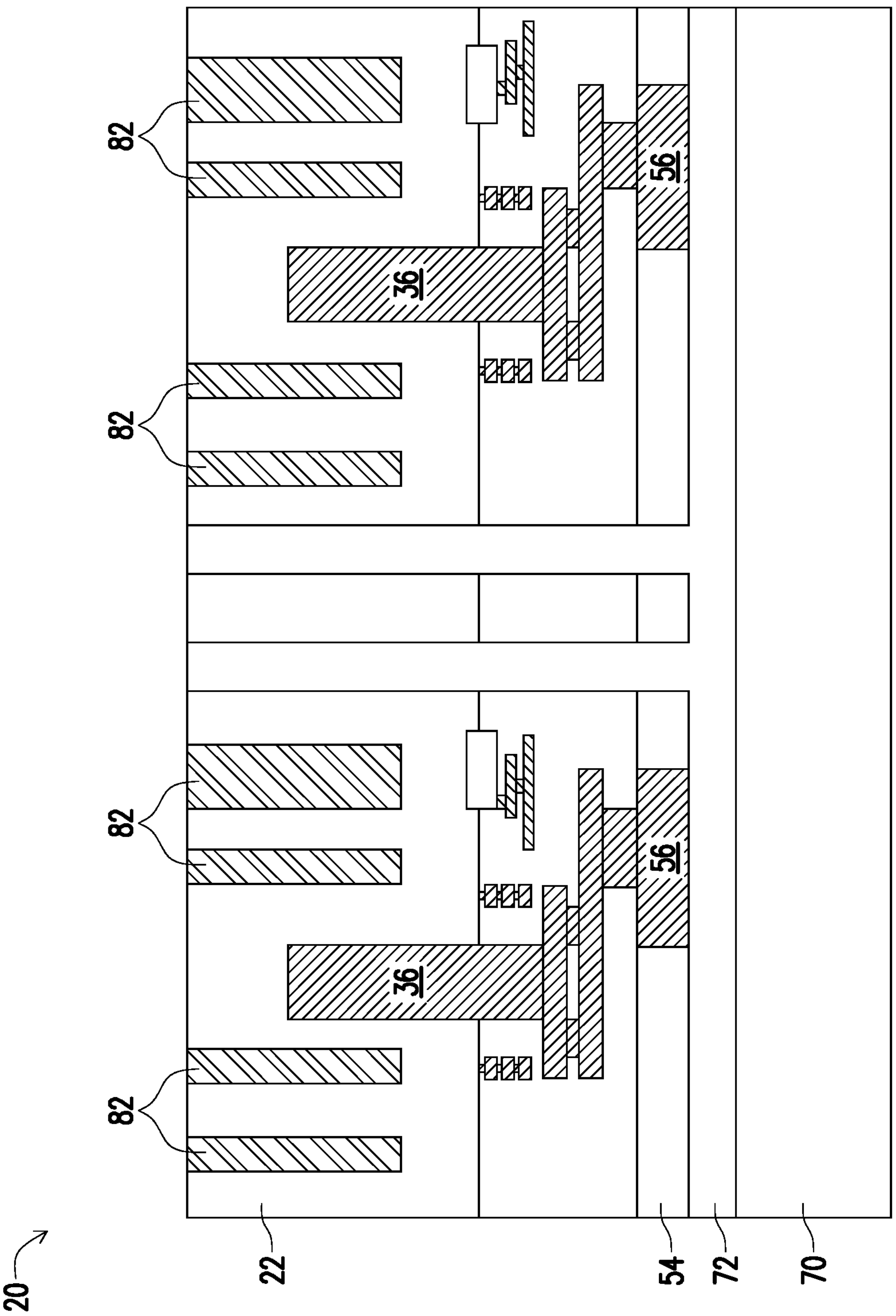

In FIG. 11, the structure 20 is thinned by thinning the substrate 22 before the subsequent singulation. The thinning may be performed through a planarization process such as a mechanical grinding process or a CMP process. The thinning process thins the substrate 22 and the warpage tuning structures 82 and exposes the dicing trenches 60 and potentially the BARC 72 in the dicing trenches 60. After thinning, the dicing trenches 60 extend through the substrate 22.

Figure 12:
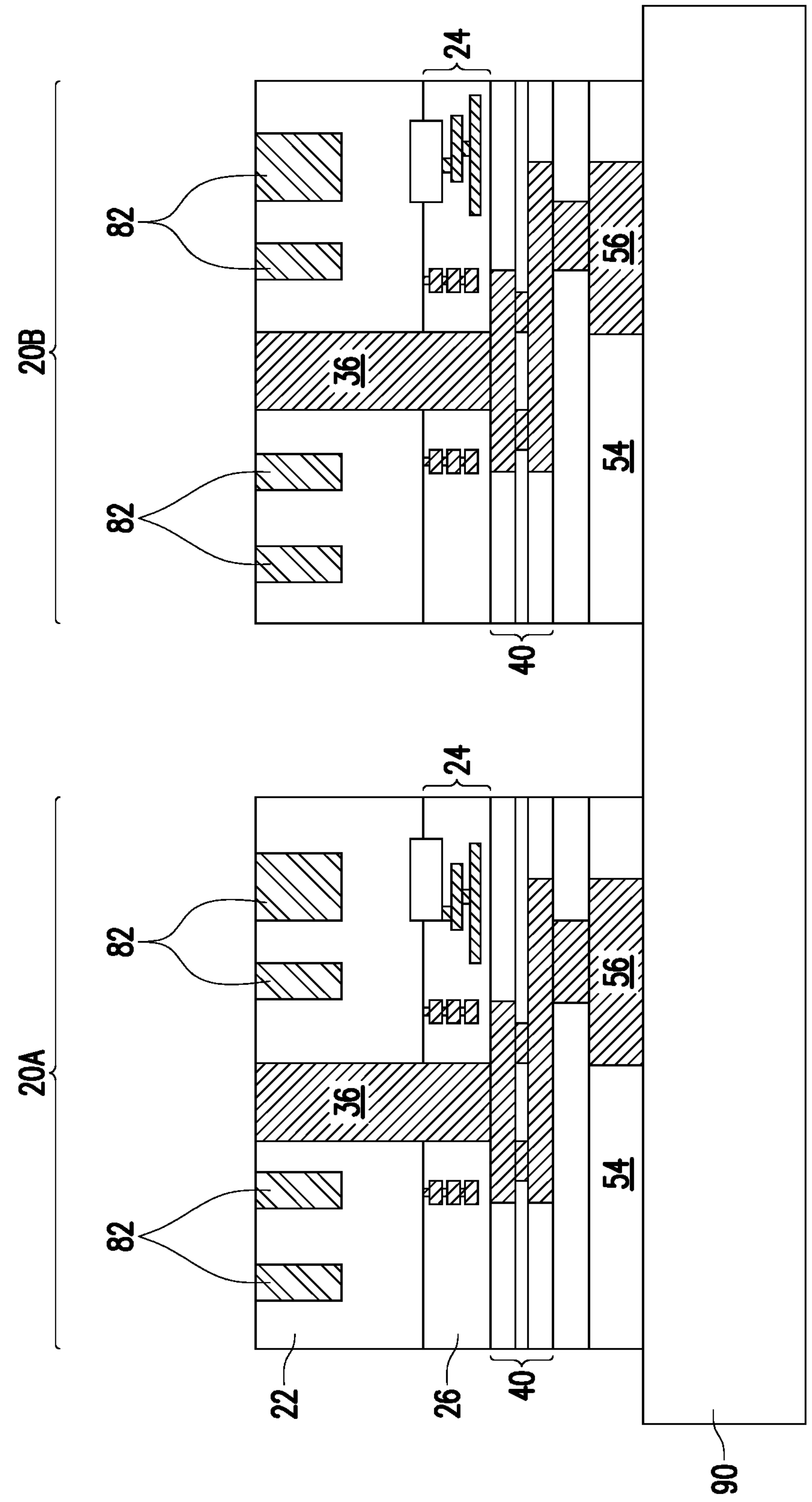

In FIG. 12, the substrate 22 is further thinned and the singulation of the structure 20 into integrated circuit dies 20A and 20B is illustrated. The dicing trenches 60, the BARC 72, and remaining substrate 22 between the trenches 60 is removed. These structures may be removed by a patterning process, such as an etching process. After the etching process, the singulated dies 20A and 20B may be removed from the carrier substrate 70 and placed on a carrier substrate 90. The carrier substrate 90 may be similar to the carrier substrate 70 and the description is not repeated herein.

After the thinning steps and the singulation process, the warpage tuning structures 82 remain in the backsides of the dies 20A and 20B. The warpage tuning structures 82 extend from the backside of the substrate 22 to overlap with the TSV 36 that extends from the frontside of the substrate 22. Said another way, the sum of the depth of one of the TSVs 36 and one of the warpage tuning structures 82 is greater than the thickness of the thinned substrate 22.

Figure 13:
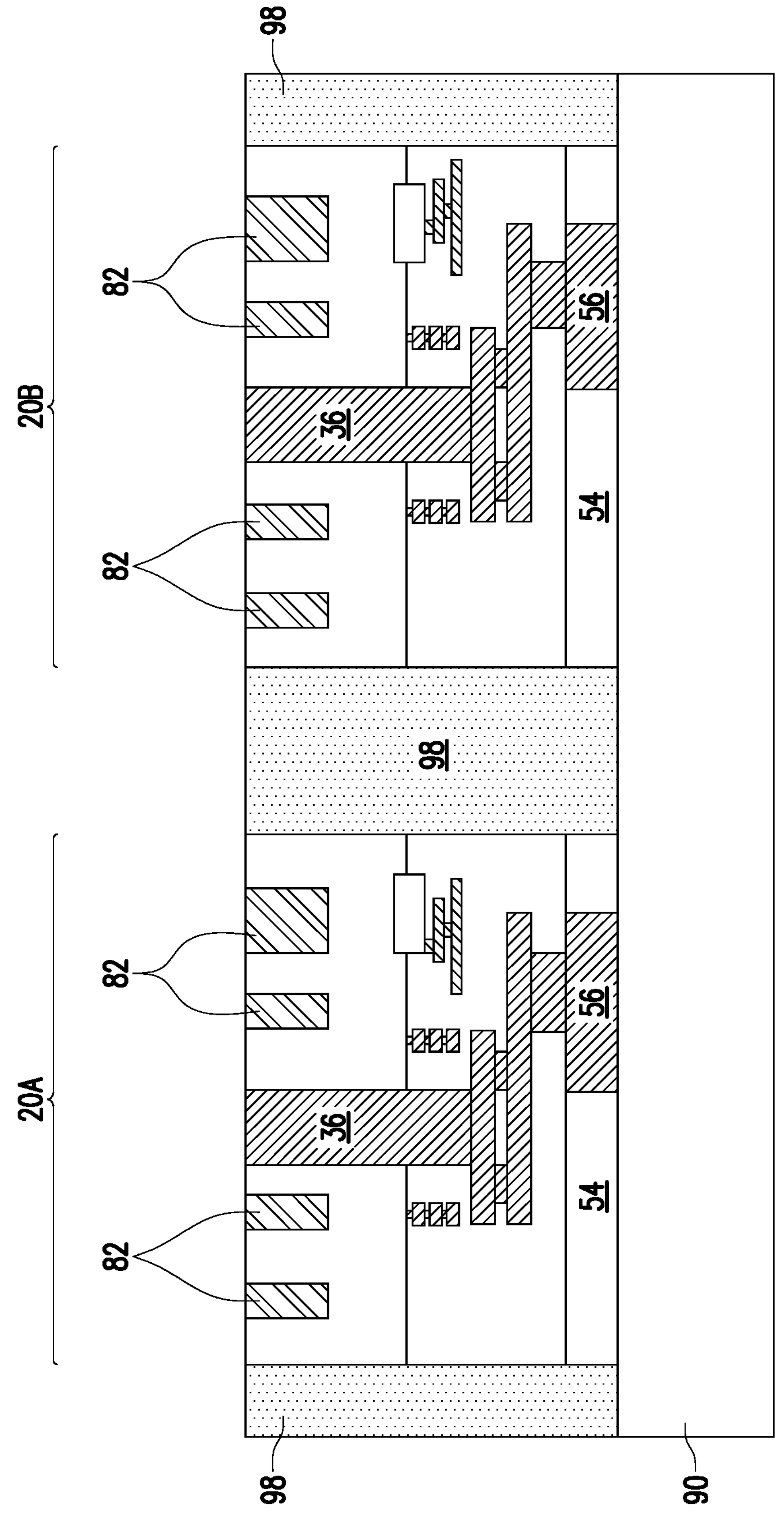

Next, as shown in FIG. 13, a gap-filling process is performed to encapsulate the singulated dies 20A and 20B in an encapsulant 98. After formation, the encapsulant 98 encapsulates the dies 20A and 20B. The encapsulant 98 may comprise an oxide. Alternatively, the encapsulant 98 may be a molding compound, a molding underfill, a resin, an epoxy, or the like. The encapsulant 98 may be applied by compression molding, transfer molding, or the like, and may be applied in liquid or semi-liquid form and then subsequently cured.

Figure 14C:
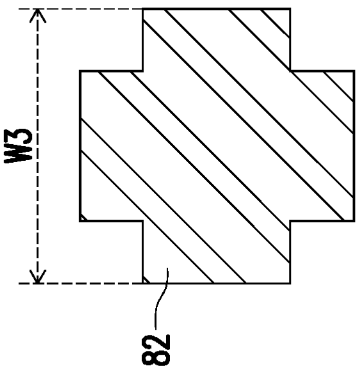
Figure 14B:
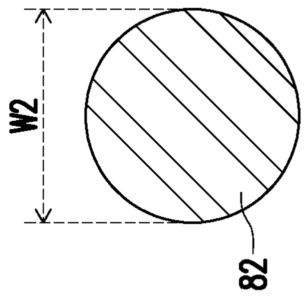
Figure 14A:
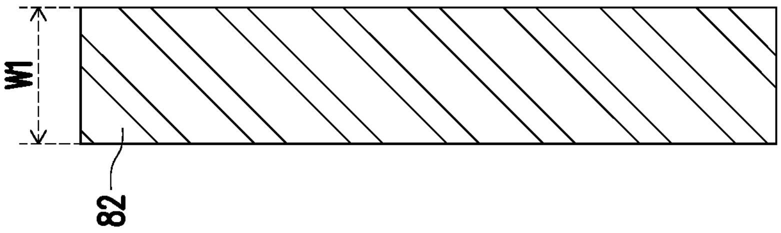

FIGS. 14A, 14B, and 14C illustrate plan views of various shapes of the warpage tuning structures 82. In FIG. 14A, the warpage tuning structure 82 is a trench shape with a width W1. In some embodiments, the width W1 is in a range from 0.36 μm to 10.8 μm. In FIG. 14B, the warpage tuning structure 82 is a circular shape with a width (or diameter) W2. In some embodiments, the width W2 is in a range from 0.3 μm to 5 μm. In FIG. 14A, the warpage tuning structure 82 is a cross shape with a width W3. In some embodiments, the width W3 is in a range from 0.36 μm to 10.8 μm.

Figure 15:
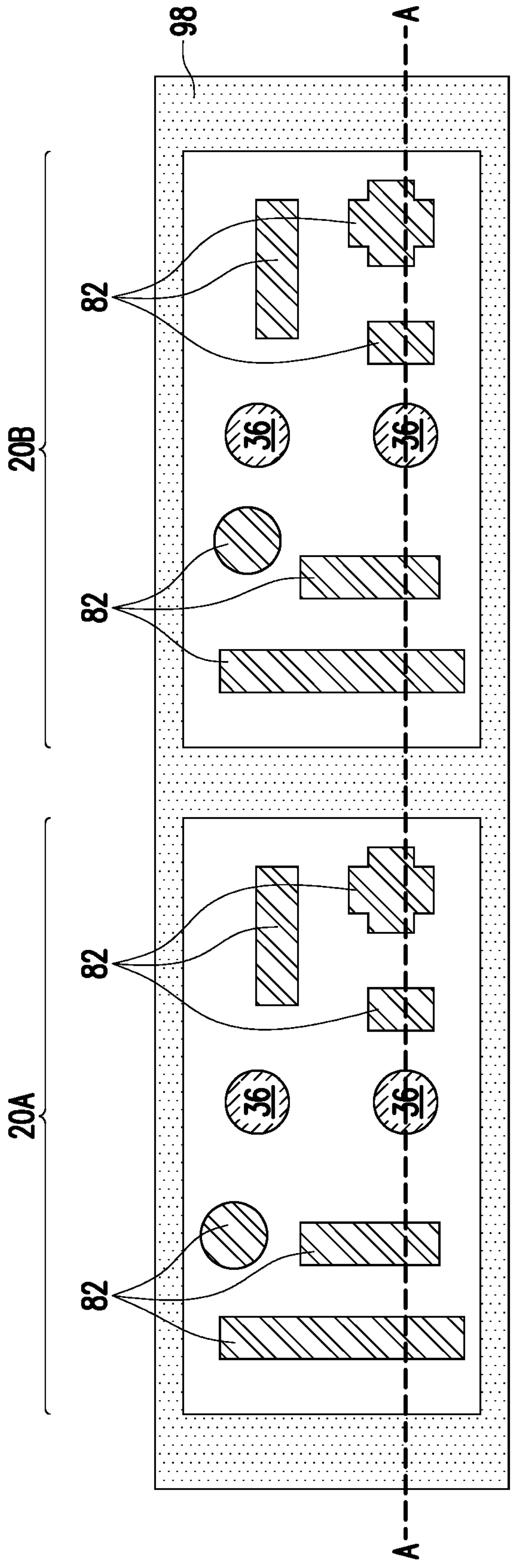

FIG. 15 illustrates a plan view of the structure of FIG. 13 with the cross-sectional view of FIG. 13 along the line A-A of FIG. 15. FIG. 15 illustrates various shapes of the warpage tuning structure 82 adjacent TSVs 36 in the dies 20A and 20B. Although dies 20A and 20B have similar configurations of TSVs 36 and warpage tuning structures 82 in FIG. 15, in some embodiments, the dies 20A and 20B can have different configurations. Further, in some embodiments, the dies 20A and 20B can have more or fewer TSVs 36 and warpage tuning structures 82.

Figure 16:
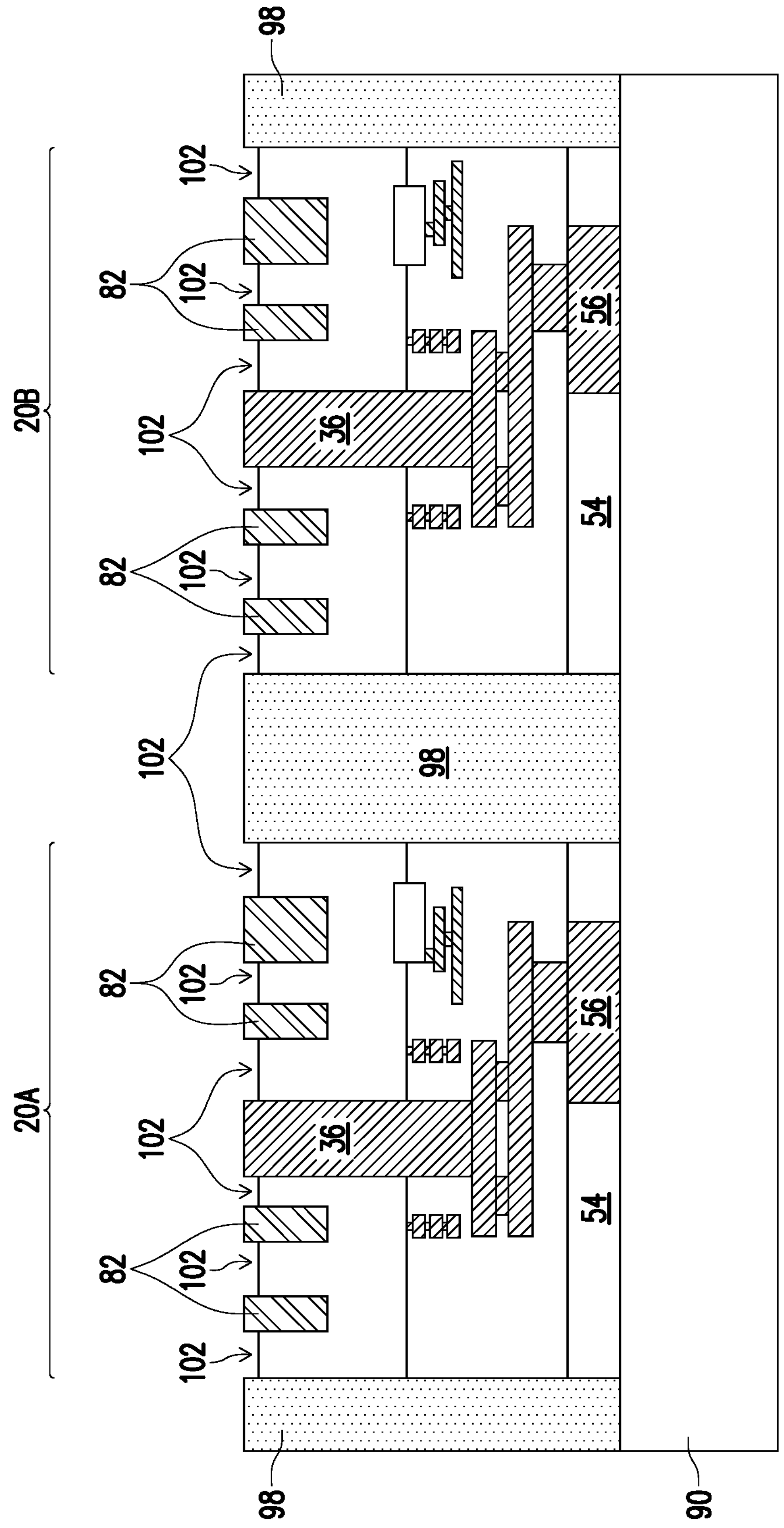

In FIG. 16, the backside of the substrate 22 is recessed to expose sidewalls of the TSVs 36 and the warpage tuning structures 82. The recessing process forms recesses 102 on backsides of the dies 20A and 20B surrounding the TSVs 36 and the warpage tuning structures 82. The recessing process may be performed by an acceptable etching process, such as by wet and/or dry etching.

Figure 17:
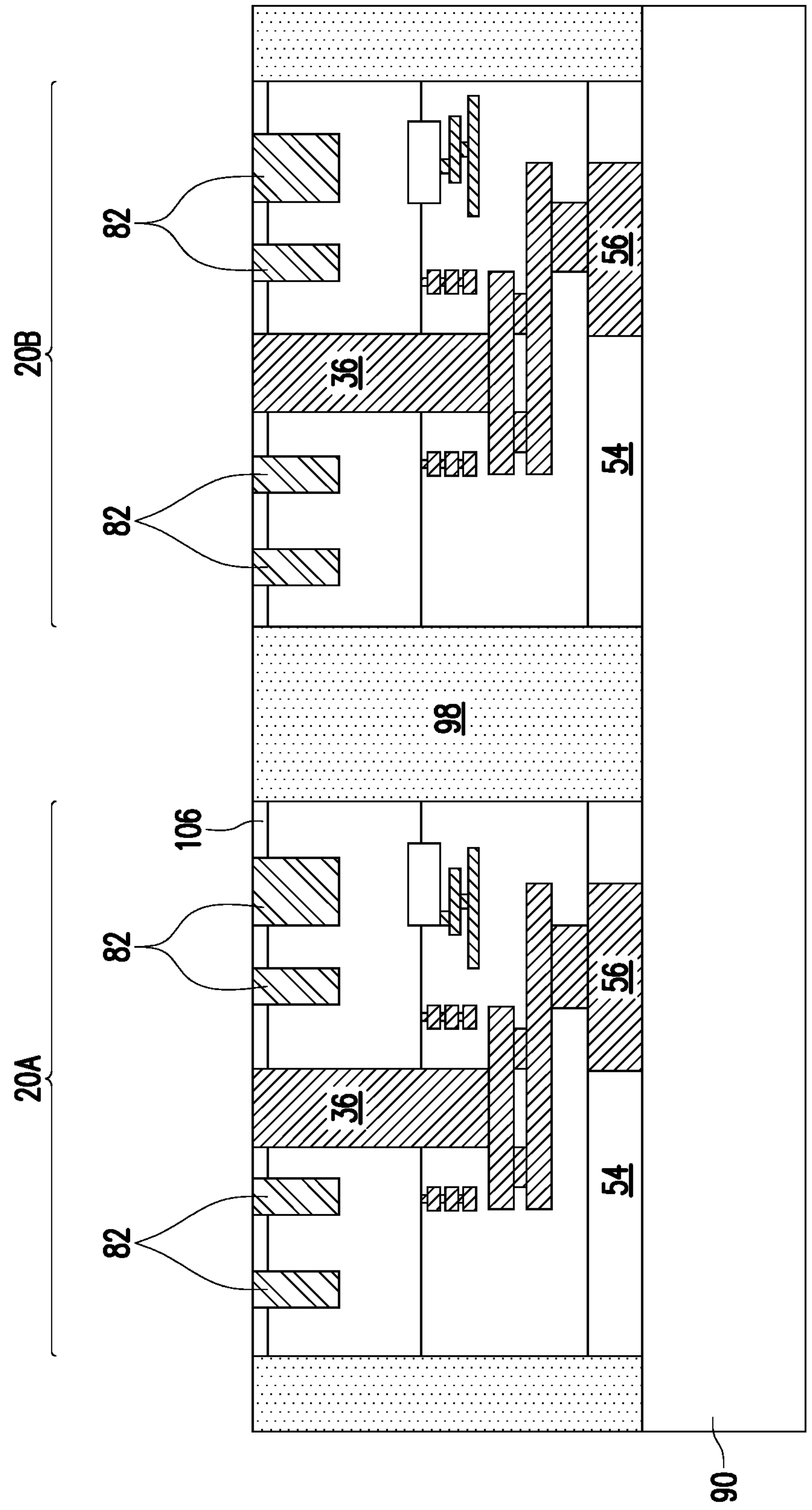

In FIG. 17, an isolation layer 106 is formed in the recesses 102 and on sidewalls of the TSVs 36 and the warpage tuning structures 82. In some embodiments, the isolation layer 106 includes an oxide such as silicon oxide, a nitride such as silicon nitride, or the like. In some embodiments, the isolation layer 106 may be a polymer-based material. In embodiments where the isolation layer 106 covers the TSVs 36 or the warpage tuning structures 82, a planarization process may be performed to re-expose the TSVs 36.

Figure 18:
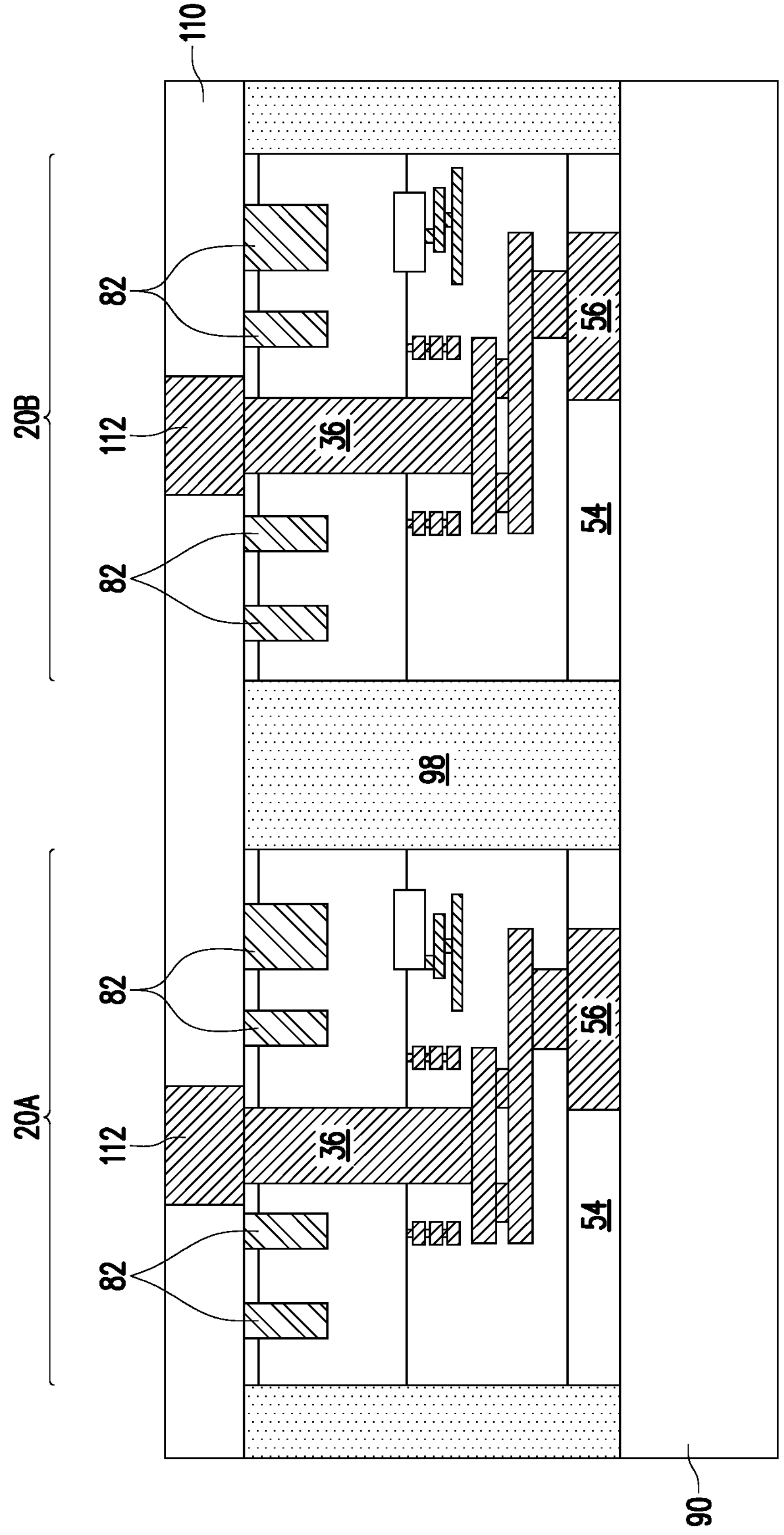

In FIG. 18, dielectric layer(s) 110 are formed over the isolation layer 106, the encapsulant 98, the TSVs 36, and the warpage tuning structures 82. Although FIG. 5 illustrates one dielectric layer 110, more dielectric layers may be formed, such as for example, three dielectric layers. The dielectric layer 110 may provide dielectric bonding functions and may be considered a bonding dielectric layer 110. In some embodiments, more dielectric layers, such as a planarization dielectric layer and an etch stop layer may be formed before the bonding layer 110 such that the bonding layer 110 is formed on these layers.

In some embodiments, the dielectric layer 110 is a silicon-containing material. For example, the dielectric layer 110 may include an oxide such as silicon oxide, a nitride such as silicon nitride, an oxynitride such as silicon oxynitride, the like, or a combination thereof.

Further, in FIG. 18, a bond pad 112 is formed in the dielectric layer(s) 110. The formation process and material of the bond pad 112 may be similar to the contact pad 56 described above and the description is not repeated herein.

Figure 19:
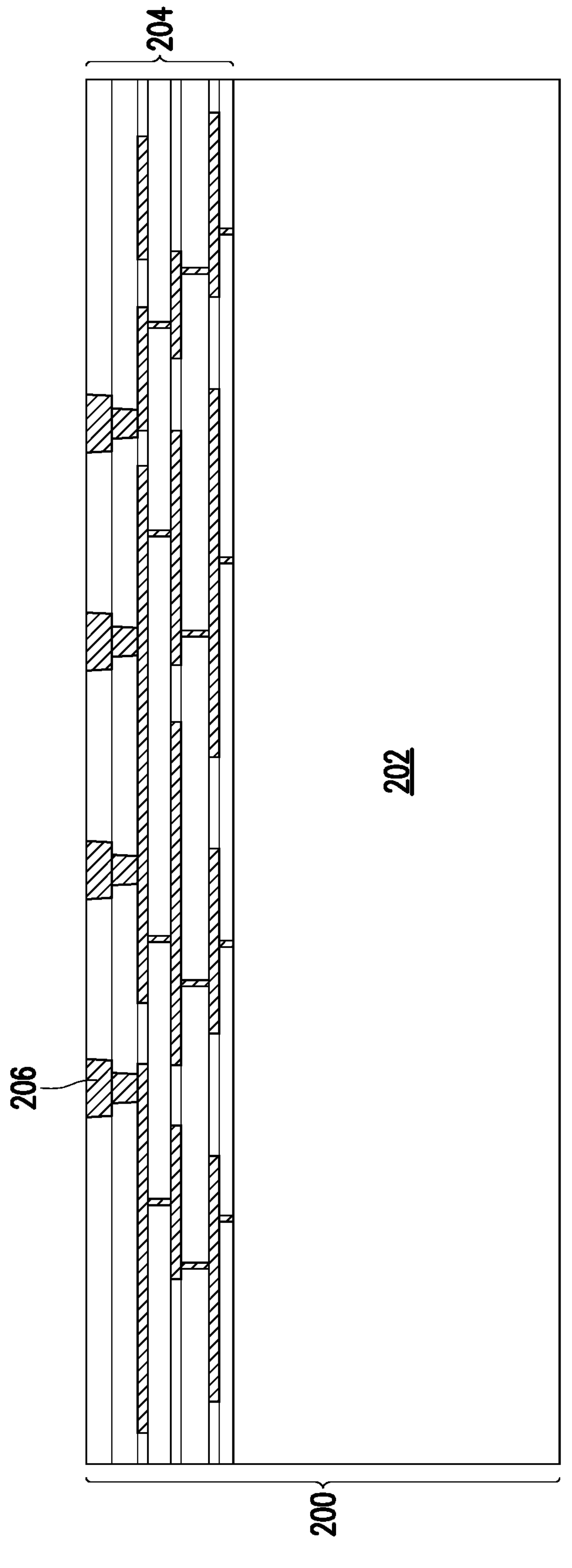
FIGS. 19 through 22 illustrate cross-sectional views of intermediate stages in the formation of a package according to embodiments.

FIGS. 19 through 22 illustrate cross-sectional views of forming a package structure in accordance with some embodiments. FIG. 19 illustrates a package structure 200. The package structure 200 includes a substrate 202, similar to the substrate 22 of the structure 20, and an interconnect structure 204 including bond pads 206. The interconnect structure 204 and the bond pads 206 may be similar to the interconnect structures 24 and 40 and pads 56 and 112, respectively, described above and the descriptions are not repeated herein. The package structure 200 may be referred to as a die 200.

Figure 20:
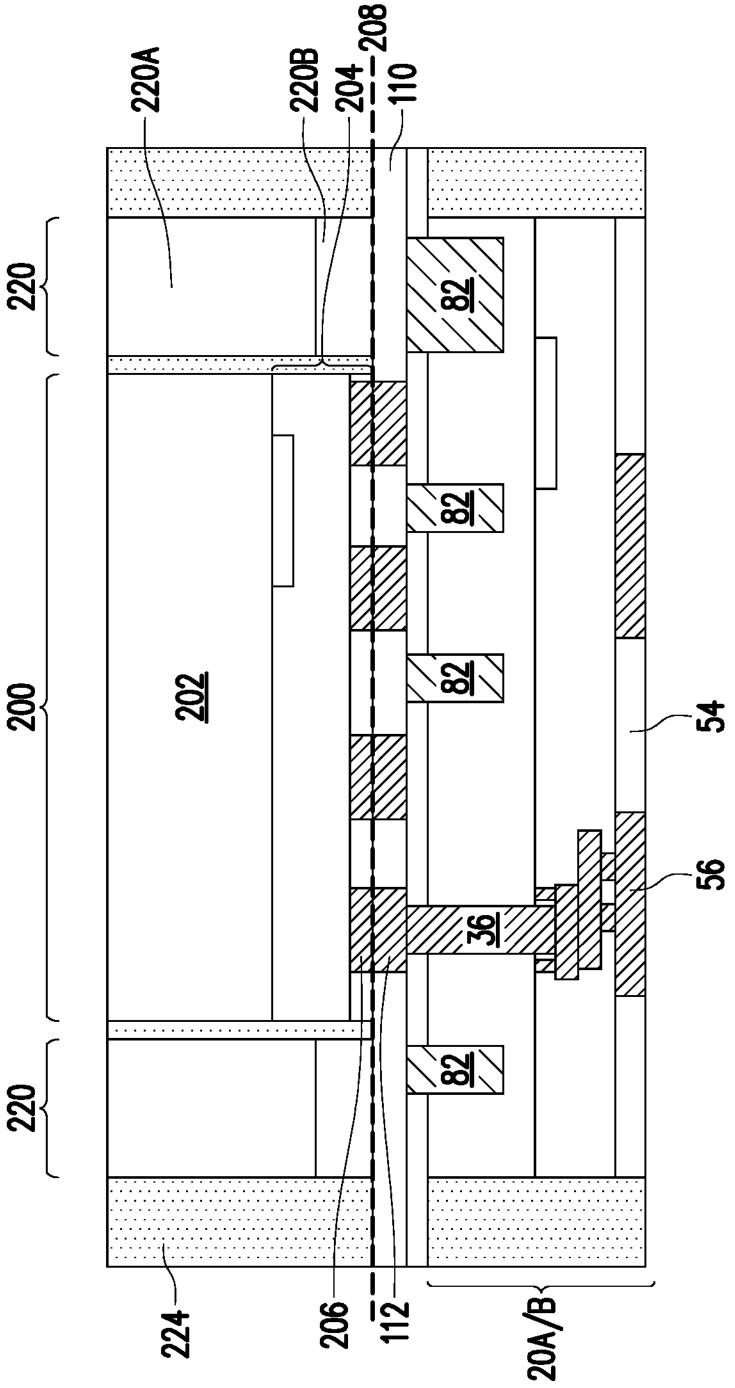

In FIG. 20, an integrated circuit die 20A/B is bonded to the package structure 200. The bonding of the integrated circuit die 20A/B to the package structure 200 may be achieved through direct bonding, in which both metal-to-metal direct bonding (between the bond pads 112 and 206) and dielectric-to-dielectric bonding (such as Si—O—Si bonding between surface dielectric layers of the integrated circuit die 20A/B and the package structure 200) are formed. Furthermore, there may be a single integrated circuit die 20A/B or a plurality of dies 20A/B bonded to the same package structure 200. The plurality of dies 20A/B bonded to the same package structure 200 may be identical to, or different from, each other to form a homogenous or a heterogeneous structure. In some embodiments, a package structure includes multiple package structures 200 and multiple integrated circuit dies 20A/B.

The die 20A/B is disposed face down such that the back sides of the die 20A/B face the package structure 200 and the front sides of the dies 20A/B face away from the package structure 200. The die 20A/B is bonded to the package structure 200 at an interface 208. As illustrated by FIG. 20, the direct bonding process directly bonds the topmost dielectric layer of the interconnect structure 204 of the package structure 200 to the topmost dielectric layer 110 of the die 20A/B at the interface 208 through fusion bonding. In an embodiment, the bond between the topmost dielectric layer of the interconnect structure 204 and the topmost dielectric layer 110 of the die 20A/B may be an oxide-to-oxide bond. The direct bonding process further directly bonds the bond pads 112 of the die 20A/B to the bond pads 206 of the package structure 200 at the interface 108 through direct metal-to-metal bonding. Thus, electrical connection between the die 20A/B and the package structure 200 is provided by the physical connection of the bond pads 112 to the bond pads 206.

As an example, the direct bonding process starts with aligning the die 20A/B with the package structure 200, for example, by aligning the bond pads 112 to the bond pads 206. When the die 20A/B and the package structure 200 are aligned, the bond pads 112 may overlap with the corresponding bond pads 206. Next, the direct bonding includes a pre-bonding step, during which the die 20A/B is put in contact with the package structure 200. The direct bonding process continues with performing an anneal, for example, at a temperature between 150° C. and 400° C. for a duration between 0.5 hours and 3 hours, so that the copper in the bond pads 112 and the bond pads 206 inter-diffuses to each other, and hence the direct metal-to-metal bonding is formed.

Further in FIG. 20, dies 220 are bonded to the backside of the dies 20A/B adjacent the package structure 200. In some embodiments, the dies 20A/B are memory structure such as a memory die (e.g., dynamic random access memory (DRAM) die, static random access memory (SRAM) die, etc.). In some embodiments, the dies 220 are dummy structures. For example, the dummy structures 220 may be used to improve the warpage control of the package structure. In some embodiments, the dies 220 include a substrate 220A and a bonding structure 220B. The dies 220 may be formed in a similar process as the die 20 and the description is not repeated herein.

Next, as shown in FIG. 20, a gap-filling process is performed to encapsulate the package structure 200 and the dies 220 in an encapsulant 224. After formation, the encapsulant 224 encapsulates the package structure 200 and the dies 220. The encapsulant 224 may comprise an oxide. Alternatively, the encapsulant 224 may be a molding compound, a molding underfill, a resin, an epoxy, or the like. The encapsulant 224 may be applied by compression molding, transfer molding, or the like, and may be applied in liquid or semi-liquid form and then subsequently cured.

Figure 21:
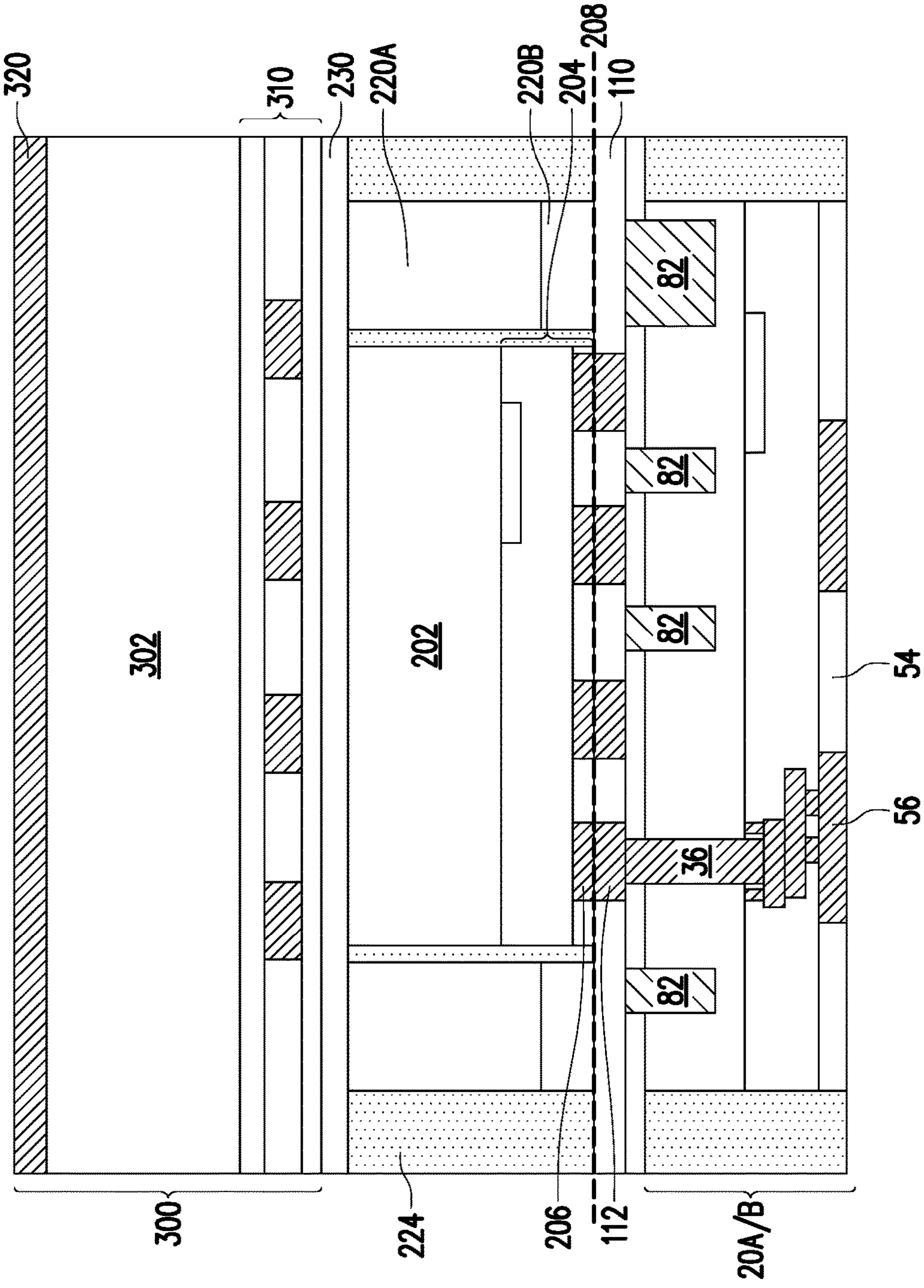

In FIG. 21, a backside structure 300 is attached to a backside of the package structure 200 and backsides of the dies 220. In some embodiments, the backside structure 300 is attached to the backside of the structure of FIG. 20 with an adhesive 230. The adhesive 230 may be a thermal interface material (TIM), a die attach film (DAF), or the like. For example, the adhesive 230 may be formed of a TIM such as a solder paste, a polymeric material, or the like, which may be dispensed on the backside of package structure 200 and backsides of the dies 220 and/or on the backside structure 300. The backside package 300 includes a substrate 302, a thermal structure 310, and backside metal 320. The substrate 302 may be similar to the substrates 22, 70, or 90 described above and the description is not repeated herein. The thermal structure 310 may include dielectric layers and thermally conductive structures configured to thermally dissipate heat from the package structure 200 and the dies 220.

In FIG. 21, backside metal 320 is formed along the backside surface of the backside structure 300. The backside metal 320 is formed of one or more layers. The backside metal 320 may include multiple layers with each layer having different compositions and functionalities, such as, an adhesion layer, a diffusion blocking layer, and an anti-oxidation layer. In some embodiments, at least one of the layers is formed of a material with high thermal conductivity. The one or more layers of the backside metal 320 may be formed of a metal or metal nitride, such as such as aluminum, titanium, titanium nitride, nickel, nickel vanadium, silver, gold, copper, combinations thereof, or the like, which may be conformally formed by a PVD process such as sputtering or evaporation, a plating process such as electroless plating or electroplating, a printing process such as inkjet printing, or the like.

Figure 22:
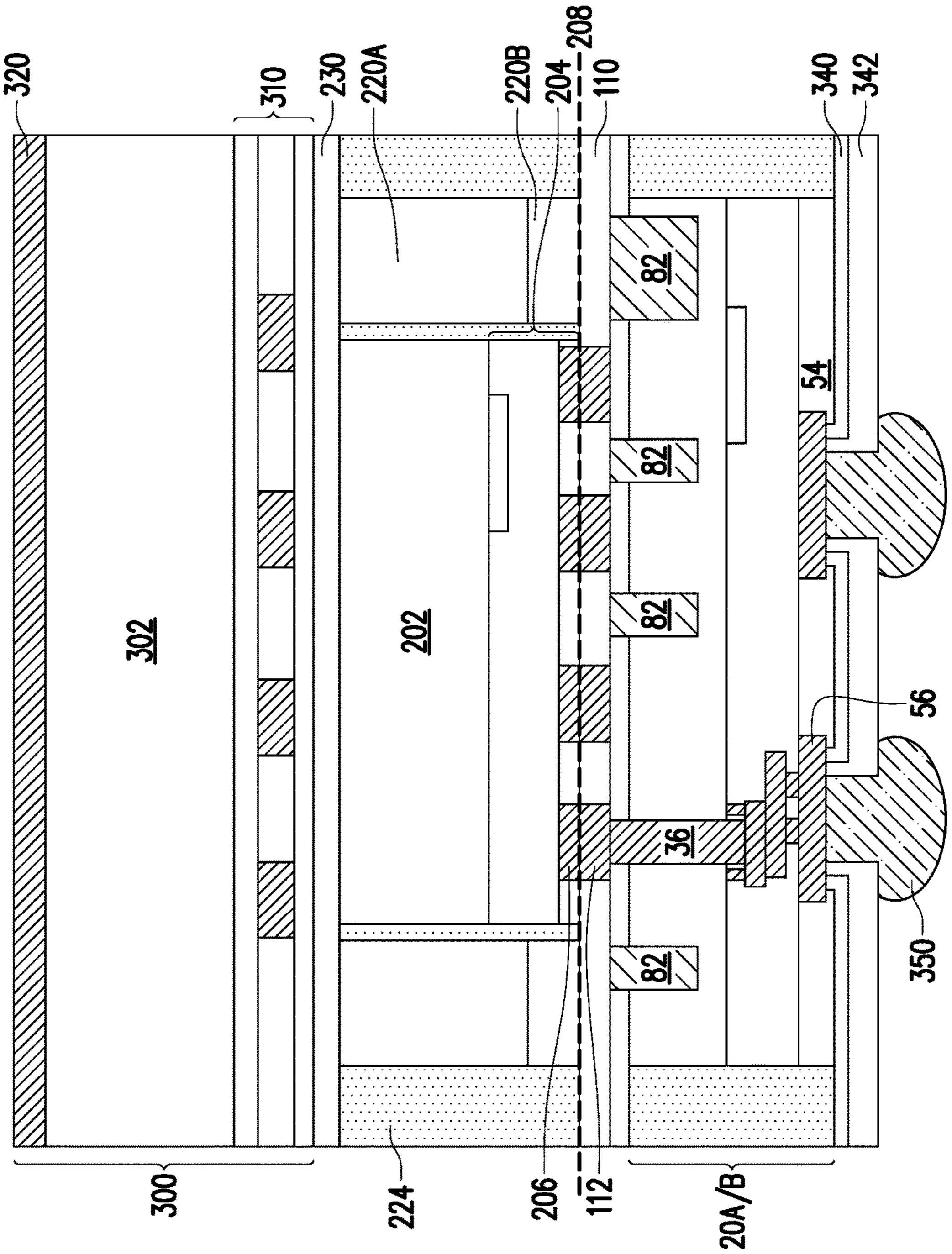

In FIG. 22, a frontside redistribution structure and conductive connectors 350 are formed to connect to the contact pads 56 of the dies 20A/B. In some embodiments, dielectric or passivation layers 340 and 342 formed over the passivation layer 54 and the contact pads 56. In some embodiments, the dielectric or passivation layers 340/342 are formed of a polymer, which may be a photo-sensitive material such as PBO, polyimide, BCB, or the like, that may be patterned using a lithography mask. In other embodiments, the dielectric or passivation layers 340/342 are formed of a nitride such as silicon nitride; an oxide such as silicon oxide, PSG, BSG, BPSG; or the like. The dielectric or passivation layers 340/342 may be formed by spin coating, lamination, CVD, the like, or a combination thereof.

Openings may be formed in the dielectric or passivation layer 340/342 with a patterning process, exposing some or all of the contact pads 56. The patterning process may be an acceptable process, such as by exposing the dielectric or passivation layer to light when the dielectric layer is a photo-sensitive material or by etching using, for example, an anisotropic etch.

The frontside redistribution structure is illustrated as an example. In some embodiments, The frontside redistribution structure may include redistribution lines (RDLs), such as metal traces (or metal lines), and vias underlying and connected to the metal traces. The redistribution lines of the redistribution structure may be physically and electrically connected to the contact pads 56.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the RDLs. The patterning forms openings through the photoresist to expose the seed layer. A conductive material is formed in the openings of the photoresist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet and/or dry etching. The remaining portions of the seed layer and conductive material form the RDLs.

More or fewer dielectric layers and metallization layers than illustrated may be formed in the redistribution structure by repeating or omitting the steps previously described.

Under-bump metallizations (UBMs) (not separately illustrated) may be formed for external connection to the contact pads 56. The UBMs have bump portions on and extending along the top surface of the upper layer 342, and have via portions extending through the upper layer 342 to physically and electrically couple the contact pads 56. As a result, the UBMs are electrically connected to the dies 20A/B (e.g., the interconnects 40 and the TSVs 36). The UBMs may be formed of the same material as the metallization layers, and may be formed by a similar process.

Conductive connectors 350 are formed on the contact pads 56 (or UBMs if present). The conductive connectors 350 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 350 may include a conductive material such as solder, copper, aluminum, gold, nickel, silver, palladium, tin, the like, or a combination thereof. In some embodiments, the conductive connectors 116 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 116 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Although FIG. 22 illustrates two dielectric or passivation layers 340 and 342, more or less layers could be included. In some embodiments, passive devices (not shown) (e.g., surface mount devices (SMDs)) may be attached to the package component (e.g., bonded to the UBMs, contact pads 56, or the metallization layers of the redistribution structure). The passive devices may be bonded to a same surface of the package component as the conductive connectors 350.

In some embodiments, the structure of FIG. 22 may undergo a subsequent singulation process to singulate it into package components. The package component of FIG. 22 may be attached to a package substrate using the conductive connectors 350 to form a package structure.

Figure 23:
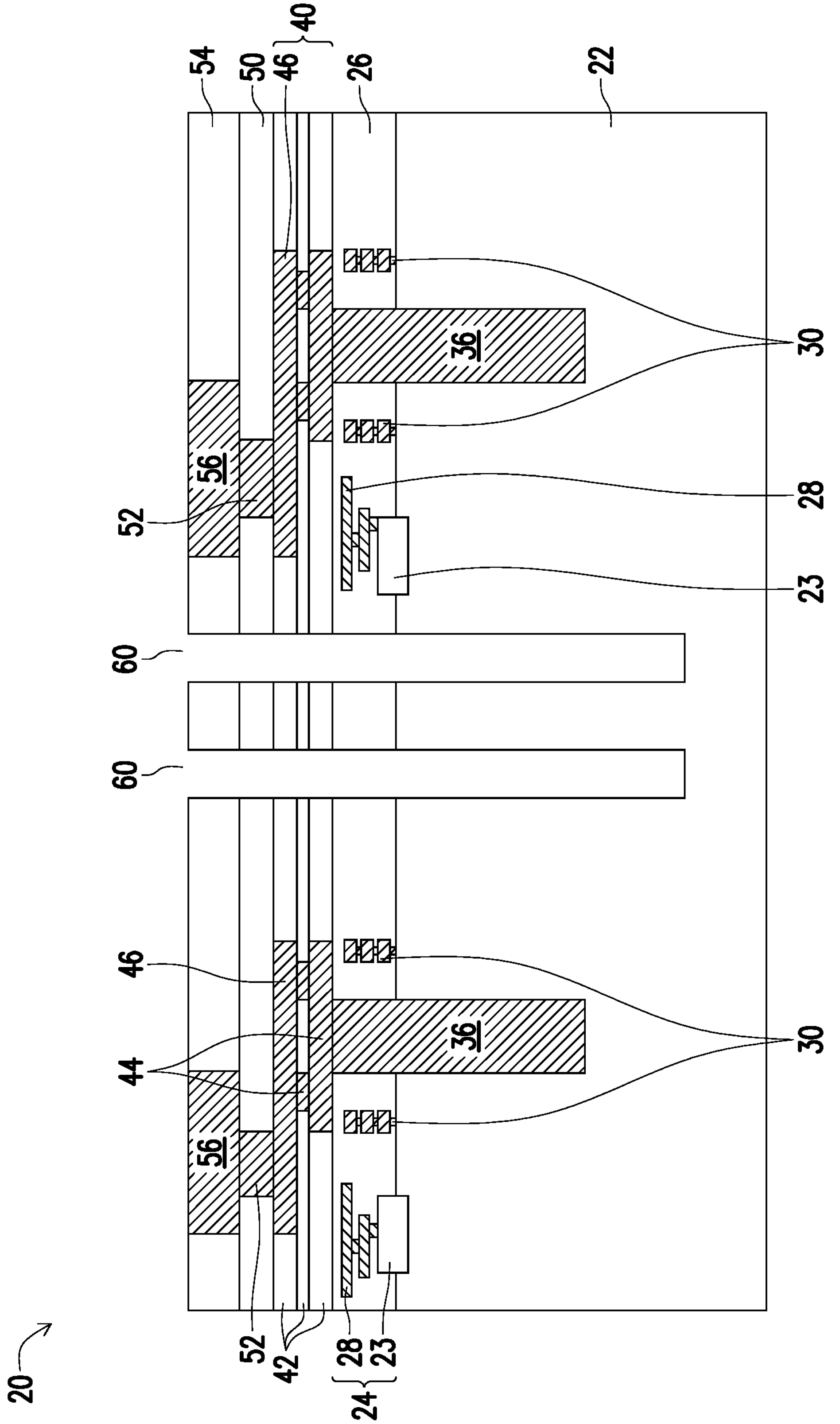
FIGS. 23 through 25 illustrate cross-sectional views of intermediate stages in the formation of a die according to embodiments.
Figure 24:
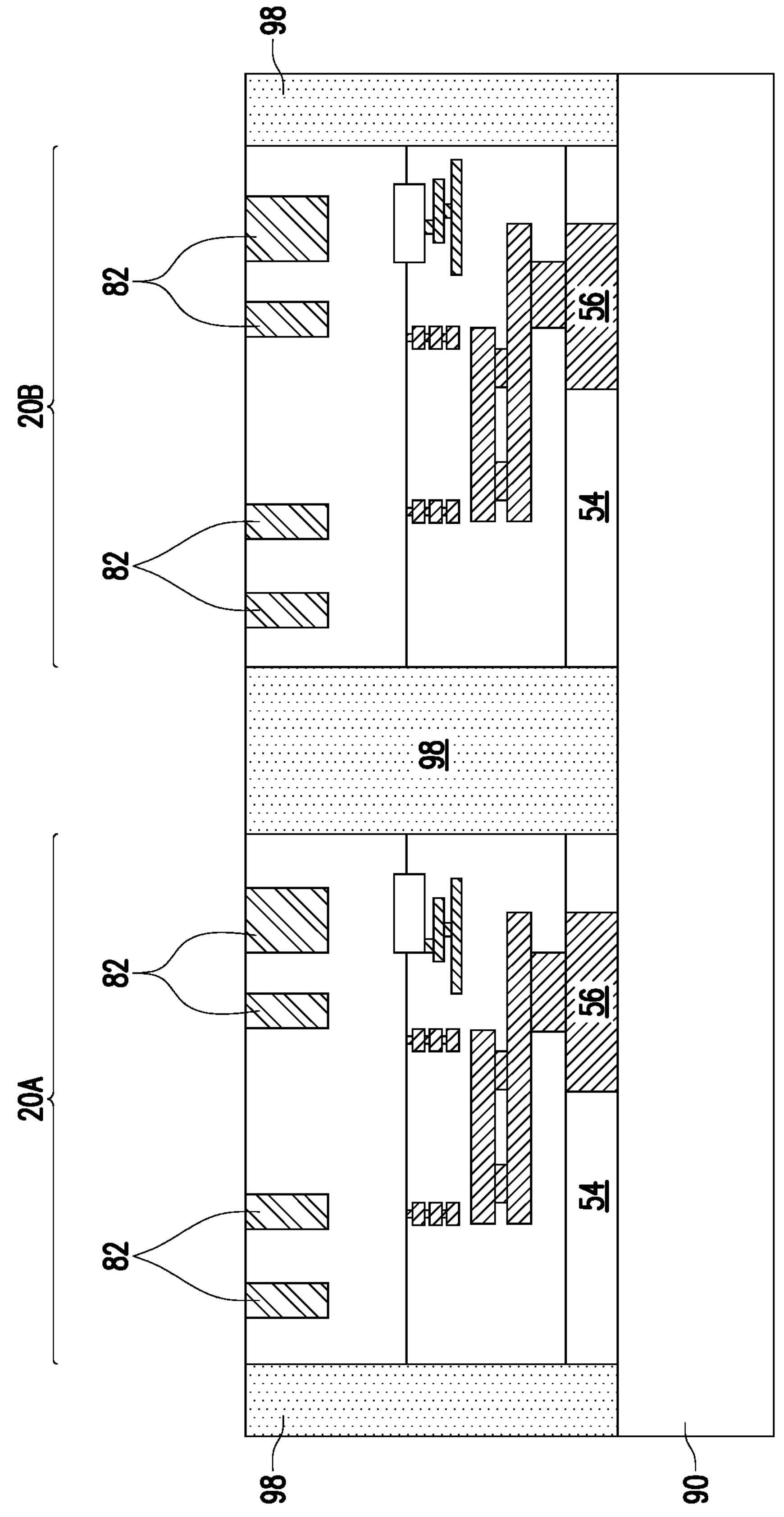
Figure 25:
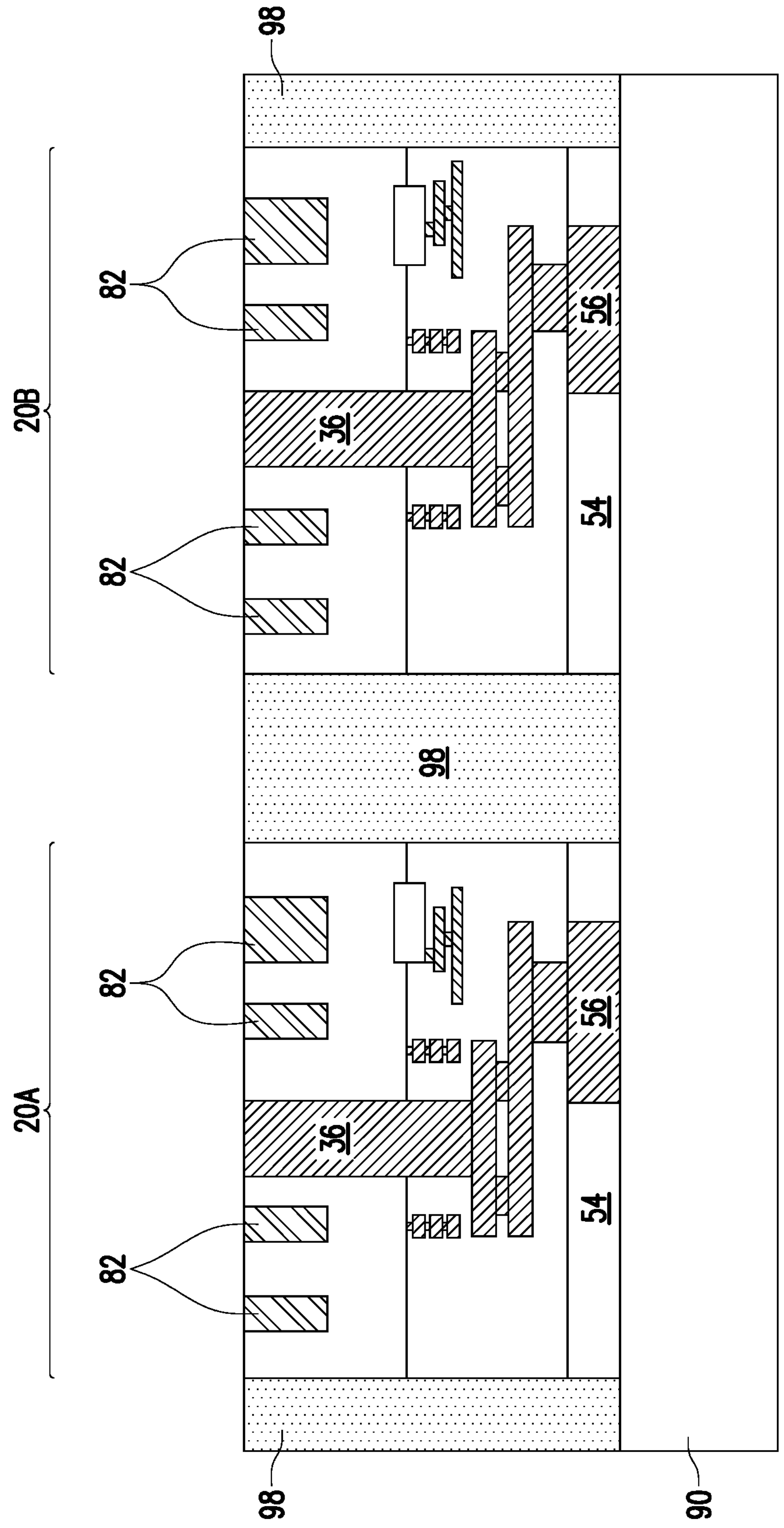

FIGS. 23 through 25 illustrate cross-sectional views of intermediate stages in the formation of a structure/dies 20 in a TSV-last process in accordance with some embodiments. Details regarding this embodiment that are similar to those for the previously described embodiment will not be repeated herein.

In these embodiments, the TSVs 36 are formed after the wafer tuning structures 82. FIG. 23 illustrates a similar step in processing as FIG. 6 described above and the description is not repeated herein. In this TSV-last embodiment, the TSVs 36 are not yet formed as compared to the TSV-first embodiment of FIG. 6.

FIG. 24 illustrates further processing of the structure of FIG. 23 similar to the processing steps illustrated and described above in FIGS. 7 through 13 and these descriptions are not repeated herein. As illustrated in FIG. 24, the warpage tuning structures 82 are formed in the backsides of the dies 20A and 20B but the TSVs 36 are not yet formed.

FIG. 25 illustrates the formation of the TSVs 36 from the backsides of the dies 20A and 20B. The formation process of the TSVs 36 is similar to the process described above in FIGS. 1 through 3 and the description is not repeated herein.

The dies 20A/B of FIG. 25 may be included in a package structure as illustrated in FIG. 22. The description of the package structure is not repeated herein.

Figure 27:
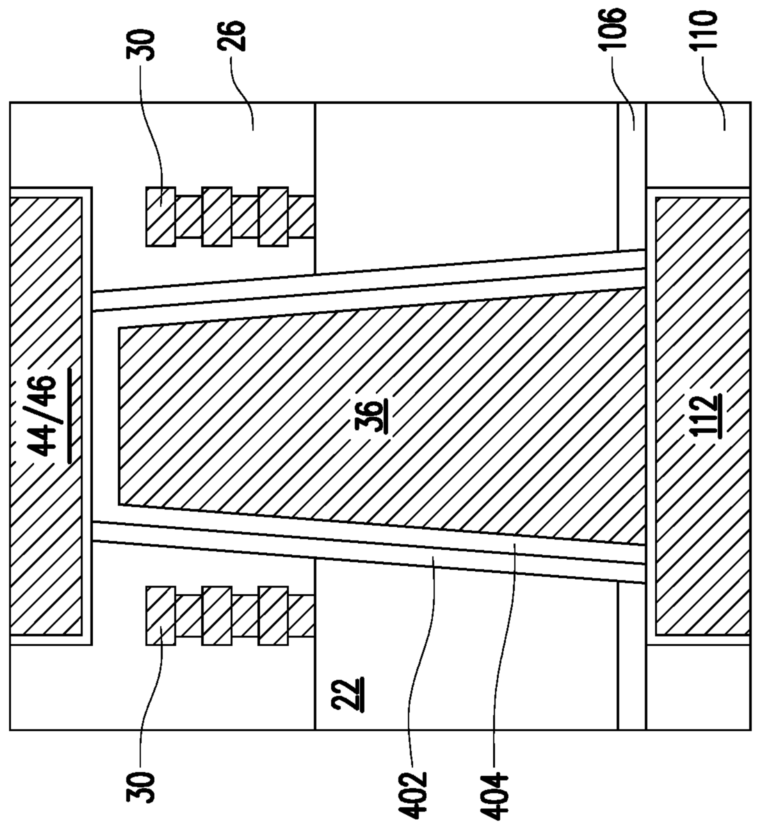
FIGS. 26 and 27 illustrate cross-sectional views of TSVs according to embodiments.
Figure 26:
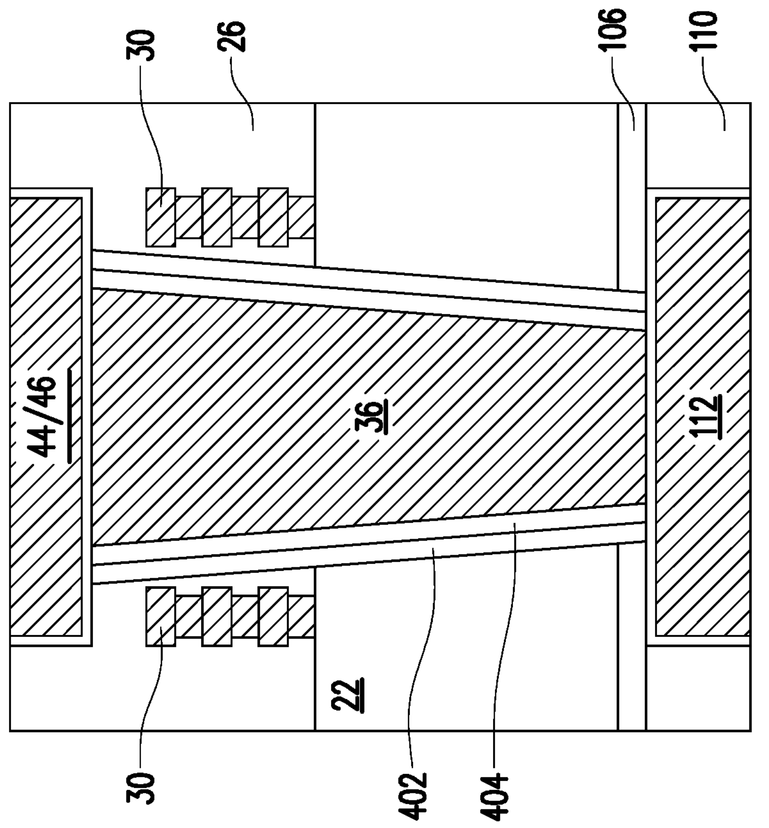

FIG. 26 illustrates a detailed views of a TSV 36 in a TSV-first embodiment. FIG. 27 illustrates a detailed views of a TSV 36 in a TSV-last embodiment. FIGS. 26 and 27 include a liner layer 402 and a barrier layer 404 on sidewalls the TSVs 36. In the TSV-last embodiment in FIG. 27, the barrier layer 404 is between and separates the metallization/top metal 44/46 and the conductive material of the TSV 36, whereas in the TSV-first embodiment of FIG. 26, the barrier layer 404 is not between the metallization/top metal 44/46 and the conductive material of the TSV 36 as it was removed during the TSV backside exposure step (see, e.g., FIGS. 11 and/or 16). Further, the taper direction of the TSVs 36 changes in the TSV-first and TSV-last embodiments. In FIG. 26, the TSV 36 tapers from the metallization/top metal 44/46 to bond pad 112. In FIG. 27, the TSV 36 tapers from the bond pad 112 to the metallization/top metal 44/46.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely a warpage tuning process that can control die warpage. In some embodiments, the warpage tuning process is applied to the backside of the die(s). For example, the warpage tuning structure may include one or more through substrate vias (TSVs) in the backside of the die(s). The warpage tuning TSVs do not necessarily extend completely through the substrate or die, but in some embodiments, extend partially into the backside of the substrate. In some embodiments, the TSVs can be filled with a tensile material, such as conductive material. In some embodiments, the TSVs can be filled with a compressive material, such as dielectric material. The compressive material may be used for dies with a backside having convex warpage (sometimes referred to as crying or frowning warpage). The tensile material may be used for dies with a backside having concave warpage (sometimes referred to as smiling warpage). By having the warpage tuning TSVs, the warpage control of the dies is improved which can improve the warpage control for package structures, such as 3DICs that include the dies. Further, in embodiments with conductive TSVs as the warpage tuning TSVs, the heat dissipation of the die can be improved.

An embodiment is a device including a first die and a substrate including a first surface and a second surface opposite the first surface. The device also includes an active device on the first surface of the substrate. The device also includes a first interconnect structure on the first surface of the substrate. The device also includes a through substrate via extending through the first interconnect structure and the substrate to the second surface of the substrate, the through substrate via being electrically coupled to metallization patterns in the first interconnect structure. The device also includes one or more material-filled trench structures extending from the second surface of the substrate into the substrate, the one or more material-filled trench structures being electrically isolated from the through substrate via.

Embodiments may include one or more of the following features. The device where the one or more material-filled trench structures include a dielectric material. The one or more material-filled trench structures include a conductive material. The device further including a dielectric layer over the one or more material-filled trench structures and the second surface of the substrate, and a bond pad in the dielectric layer. The device further including second die bonded to the bond pad of the first die. The device further including a contact pad over and electrically coupled to the first interconnect structure, and a conductive connector electrically coupled to the contact pad. The one or more material-filled trench structures form a warpage tuning structure. The width of the through substrate via decreases moving from the first surface of the substrate to the second surface. The width of the through substrate via increases moving from the first surface of the substrate to the second surface.

An embodiment is a method including forming a first die including a substrate, the substrate including a first surface and a second surface opposite the first surface. The method also includes forming an active device on the first surface of the substrate. The method also includes forming a first interconnect structure on the first surface of the substrate. The method also includes forming a through substrate via extending through the first interconnect structure and the substrate to the second surface of the substrate, the through substrate via being electrically coupled to metallization patterns in the first interconnect structure. The method also includes forming one or more material-filled trench structures extending from the second surface of the substrate into the substrate, the one or more material-filled trench structures being electrically isolated from the through substrate via.

Embodiments may include one or more of the following features. The method where the one or more material-filled trench structures include at least two material-filled trench structures, where a first one of the material-filled trench structures include a dielectric material, and where a second one of the material-filled trench structures include a conductive material. Forming the one or more material-filled trench structures extending from the second surface of the substrate into the substrate includes etching trenches into the second surface of the substrate, filling the trenches with material, and thinning the second surface of the substrate to expose the through substrate via. The method further including forming a dielectric layer over the one or more material-filled trench structures and the thinned second surface of the substrate, and forming a bond pad in the dielectric layer and electrically coupled to the through substrate via. The method further including directly bonding a second die bonded to the bond pad of the first die. The through substrate via is formed before the material-filled trench structures. The through substrate via is formed after the material-filled trench structures. The method further including forming a contact pad over and electrically coupled to the first interconnect structure, and forming a conductive connector electrically coupled to the contact pad.

An embodiment is a method including forming a first die including a first surface and a second surface opposite the first surface, where forming the first die includes forming a first interconnect structure over a first substrate, the first interconnect structure including a metallization pattern. The method also includes forming through substrate vias through the first interconnect structure and the first substrate. The method also includes forming contact pads over the first interconnect structure and the through substrate vias, the bond pads being on the first surface of the first die. The method also includes forming trenches in the second surface of the first die. The method also includes filling the trenches in the second surface of the first die with a first material. The method also includes recessing the second surface of the first die to expose the through substrate vias. The method also includes forming bond pads on the recessed second surface of the first die. The method also includes directly bonding the bond pads of the first die to bond pads of a second die.

Embodiments may include one or more of the following features. The method where the first material is a conductive material. The method further including forming a contact pad over and electrically coupled to the first interconnect structure, and forming a solder connector electrically coupled to the contact pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first die comprising a substrate, the substrate including a first surface and a second surface opposite the first surface;

forming an active device on the first surface of the substrate;

forming a first interconnect structure on the first surface of the substrate;

forming a through substrate via extending through the first interconnect structure and the substrate to the second surface of the substrate, the through substrate via being electrically coupled to metallization patterns in the first interconnect structure; and forming one or more material-filled trench structures extending from the second surface of the substrate into the substrate, the one or more material-filled trench structures being electrically isolated from the through substrate via.

2. The method of claim 1, wherein the one or more material-filled trench structures include at least two material-filled trench structures, wherein a first one of the material-filled trench structures comprises a dielectric material, and wherein a second one of the material-filled trench structures comprises a conductive material.

3. The method of claim 1, wherein forming the one or more material-filled trench structures extending from the second surface of the substrate into the substrate comprises:
etching trenches into the second surface of the substrate;
filling the trenches with material; and
thinning the second surface of the substrate to expose the through substrate via.

4. The method of claim 3, further comprising:
forming a dielectric layer over the one or more material-filled trench structures and the thinned second surface of the substrate; and
forming a bond pad in the dielectric layer and electrically coupled to the through substrate via.

5. The method of claim 4, further comprising:
directly bonding a second die bonded to the bond pad of the first die.

6. The method of claim 1, wherein the through substrate via is formed before the material-filled trench structures.

7. The method of claim 1, wherein the through substrate via is formed after the material-filled trench structures.

8. The method of claim 1, further comprising:
forming a contact pad over and electrically coupled to the first interconnect structure; and
forming a conductive connector electrically coupled to the contact pad.

9. A method, comprising:
forming a first die including a first surface and a second surface opposite the first surface, wherein forming the first die comprises:
forming a first interconnect structure over a first substrate, the first interconnect structure comprising a metallization pattern;
forming through substrate vias through the first interconnect structure and the first substrate; and
forming bond pads over the first interconnect structure and the through substrate vias, the bond pads being on the first surface of the first die;
forming trenches in the second surface of the first die;
filling the trenches in the second surface of the first die with a first material;
recessing the second surface of the first die to expose the through substrate vias; and
forming bond pads on the recessed second surface of the first die; and
directly bonding the bond pads of the first die to bond pads of a second die.

10. The method of claim 9, wherein the first material is a conductive material.

11. The method of claim 9, further comprising:
forming a contact pad over and electrically coupled to the first interconnect structure; and
forming a solder connector electrically coupled to the contact pad.

12. A method, comprising:
providing a substrate having a first surface and a second surface opposite the first surface;
forming an active device on the first surface of the substrate;
forming an interconnect structure on the first surface of the substrate;
forming a through substrate via extending through the interconnect structure and the substrate, the through substrate via being electrically coupled to metallization patterns in the interconnect structure;
determining a warpage profile of the substrate, the warpage profile being one of concave warpage or convex warpage;
selecting a fill material based on the warpage profile, wherein a tensile material is selected for concave warpage and a compressive material is selected for convex warpage;
etching one or more trenches in the second surface of the substrate;
filling the one or more trenches with the selected fill material to form one or more warpage tuning structures, the one or more warpage tuning structures being electrically isolated from the through substrate via; and
thinning the second surface of the substrate to expose the through substrate via.

13. The method of claim 12, wherein the tensile material comprises a conductive material.

14. The method of claim 12, wherein the compressive material comprises a dielectric material.

15. The method of claim 12, wherein the through substrate via is formed before the one or more warpage tuning structures.

16. The method of claim 12, wherein the through substrate via is formed after the one or more warpage tuning structures.

17. The method of claim 12, further comprising:
forming a dielectric layer over the one or more warpage tuning structures and the thinned second surface of the substrate; and
forming a bond pad in the dielectric layer and electrically coupled to the through substrate via.

18. The method of claim 12, further comprising:
forming guard rings around the through substrate via, the guard rings being formed simultaneously with the metallization patterns in the interconnect structure.

19. The method of claim 12, wherein a sum of a depth of the through substrate via and a depth of one of the one or more warpage tuning structures is greater than a thickness of the substrate.

20. The method of claim 12, wherein the substrate, the interconnect structure, the active device, the through substrate via, and the warpage tuning structures are parts of a semiconductor die, the method further comprising:
encapsulating the semiconductor die in an encapsulant.

* * * * *